(12) United States Patent
Jang et al.

(10) Patent No.: US 9,431,414 B2
(45) Date of Patent: Aug. 30, 2016

(54) VERTICAL MEMORY DEVICES AND METHODS OF MANUFACTURING THE SAME

(71) Applicants: Byong-Hyun Jang, Suwon-si (KR); Dong-Chul Yoo, Seongnam-si (KR); Ki-Hyun Hwang, Seongnam-si (KR); Phil-Ouk Nam, Hwaseong-si (KR); Jae-Young Ahn, Seongnam-si (KR)

(72) Inventors: Byong-Hyun Jang, Suwon-si (KR); Dong-Chul Yoo, Seongnam-si (KR); Ki-Hyun Hwang, Seongnam-si (KR); Phil-Ouk Nam, Hwaseong-si (KR); Jae-Young Ahn, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 33 days.

(21) Appl. No.: 14/517,025

(22) Filed: Oct. 17, 2014

(65) Prior Publication Data

US 2015/0145021 A1    May 28, 2015

(30) Foreign Application Priority Data

Nov. 27, 2013 (KR) .................. 10-2013-0145724

(51) Int. Cl.
*H01L 27/115* (2006.01)
*H01L 29/66* (2006.01)
*H01L 29/792* (2006.01)

(52) U.S. Cl.
CPC ..... *H01L 27/11565* (2013.01); *H01L 27/1158* (2013.01); *H01L 29/66833* (2013.01); *H01L 29/7926* (2013.01)

(58) Field of Classification Search
None
See application file for complete search history.

(56) References Cited

U.S. PATENT DOCUMENTS

| 2005/0101087 | A1* | 5/2005 | Endoh | H01L 29/7926 438/257 |
| 2011/0287612 | A1* | 11/2011 | Lee | H01L 27/11578 438/478 |
| 2011/0310670 | A1* | 12/2011 | Shim | G11C 16/0408 365/185.17 |
| 2012/0064682 | A1* | 3/2012 | Jang | H01L 21/28273 438/268 |
| 2012/0146110 | A1 | 6/2012 | Jung | |
| 2012/0170369 | A1* | 7/2012 | Kim | H01L 29/792 365/185.05 |
| 2012/0224426 | A1* | 9/2012 | Nam | G11C 16/0483 365/185.11 |
| 2013/0009229 | A1* | 1/2013 | Lee | H01L 29/66833 257/314 |
| 2013/0100738 | A1 | 4/2013 | Choi | |
| 2013/0140623 | A1* | 6/2013 | Lee | H01L 29/792 257/324 |
| 2013/0214344 | A1* | 8/2013 | Lim | H01L 29/792 257/324 |
| 2014/0092686 | A1 | 4/2014 | Shim et al. | |

FOREIGN PATENT DOCUMENTS

| KR | 1020100091900 A | 8/2010 |
| KR | 1020100097459 A | 9/2010 |
| KR | 1020110001527 A | 1/2011 |
| KR | 1020120035748 A | 4/2012 |
| KR | 1020120080075 A | 7/2012 |
| KR | 1020120128438 A | 11/2012 |

* cited by examiner

*Primary Examiner* — Daniel Luke
(74) *Attorney, Agent, or Firm* — Myers Bigel & Sibley, P.A.

(57) ABSTRACT

Nonvolatile memory devices include at least four cylindrical-shaped channel regions, which extend vertically from portions of a substrate located at respective vertices of at least one rhomboid when viewed in a vertical direction relative to a surface of the substrate. A charge storage layer (e.g., ONO layer) is provided on an outer sidewall of each of the cylindrical-shaped channel regions. In addition, to achieve a high degree of integration, a plurality of vertically stacked gate electrodes are provided, which extend adjacent each of the cylindrical-shaped channel regions.

12 Claims, 21 Drawing Sheets

VERTICAL MEMORY DEVICES AND METHODS OF MANUFACTURING THE SAME

REFERENCE TO PRIORITY APPLICATION

This application claims priority under 35 USC §119 to Korean Patent Application No. 10-2013-0145724, filed on Nov. 27, 2013 in the Korean Intellectual Property Office (KIPO), the contents of which are hereby incorporated herein by reference in their entirety.

BACKGROUND

1. Field

Example embodiments relate to vertical memory devices and methods of manufacturing the same. More particularly, example embodiments relate to vertical memory devices having a vertical channel and methods of manufacturing the same.

2. Description of the Related Art

In methods of manufacturing vertical memory devices, an insulation layer and a sacrificial layer may be alternately and repeatedly formed on a substrate. Holes may be formed though the insulation layers and the sacrificial layers. Channels may be formed to fill the holes. Openings may be formed through the insulation layers and the sacrificial layers. The sacrificial layers exposed by the openings may be removed to form gaps exposing the channels. ONO layers and gate structures including gate electrodes may be formed to fill the gaps.

In order to increase the degree of integration, more channels may be disposed in a predetermined area. When the channels may be disposed adjacent to each other, voids may occur during a process for forming a gate electrode layer, and a space for receiving bit lines may be insufficient.

SUMMARY

Nonvolatile memory devices according to some embodiments of the invention can include at least four cylindrical-shaped channel regions, which extend vertically from portions of a substrate located at respective vertices of at least one rhomboid when viewed in a vertical direction relative to a surface of the substrate. A charge storage layer (e.g., ONO layer) is provided on an outer sidewall of each of the cylindrical-shaped channel regions. In addition, to achieve a high degree of integration, a plurality of vertically-stacked gate electrodes are provided, which extend adjacent each of the cylindrical-shaped channel regions.

According to additional embodiments of the invention, the memory device includes at least seven cylindrical-shaped channel regions, which are positioned at high density at respective vertices of two rhomboids that share a common vertex when viewed in a vertical direction relative to the surface of the substrate. According to still further embodiments of the invention, the memory device includes five cylindrical-shaped channel regions, which are positioned at respective vertices of two rhomboids that share three common vertices when viewed in a vertical direction relative to the surface of the substrate. According to further embodiments of the invention, the memory device includes seven cylindrical-shaped channel regions positioned at respective vertices of four rhomboids that share a common vertex when viewed in a vertical direction relative to the surface of the substrate. In particular, one of the seven cylindrical-shaped channel regions may be located at a vertex that is shared by each of the four rhomboids.

According to additional embodiments, there is provided a vertical memory device. The vertical memory device includes a plurality of channel arrays, a charge storage layer structure, and a plurality of gate electrodes. The plurality of channel arrays includes a plurality of channels in a first region on a substrate. Each of the channels extends in a first direction substantially perpendicular to a top surface of the substrate. The charge storage layer structure includes a tunnel insulation layer pattern, a charge storage layer pattern and a blocking layer pattern which are sequentially stacked on a sidewall of each channel in a second direction substantially parallel to the top surface of the substrate. The plurality of gate electrodes are arranged on a sidewall of the charge storage layer structure, and spaced apart from each other in the first direction. Each of the channel array includes a first channel column including a plurality of first channels disposed at a central portion of the first region with respect to a third direction substantially perpendicular to the first direction and the second direction, a second channel column including a plurality of second channels disposed at a outer portion of the first region, and a third channel column including a plurality of third channels disposed at the outer portion of the first region. The second channels are spaced apart from respective first channels in a fourth direction oblique to the third direction, The third channels are spaced apart from respective second channels in the second direction.

In example embodiments, the first channels, the second channels and the third channels may be arranged in a zigzag pattern with respect to the third direction.

In example embodiments, the vertical memory device may further include a first conductive pattern electrically connecting a second channel of one channel array with a third channel of another channel array, and a second conductive pattern electrically connecting a third channel of one channel array with a second channel of the other channel array.

In example embodiments, the plurality of channel arrays may include a first channel array, a second channel array spaced apart from the first channel array in a direction opposed to the second direction, and a third channel array spaced apart from the first channel array in the second direction.

In example embodiments, the first conductive pattern may electrically connect the second channel of the first channel array with the third channel of the second channel array, and the second conductive pattern may electrically connect the third channel of the first channel array with the second channel of the third channel array.

In example embodiments, a plurality of first conductive patterns may be arranged in the third direction, and a plurality of second conductive patterns may be arranged in the third direction.

In example embodiments, a central portion of the first conductive pattern may be curved in the third direction, and a central portion of the second conductive pattern may be curved in a direction opposed to the third direction.

In example embodiments, the central portion of the first conductive pattern may not overlap the central portion of the second conductive pattern with respect to the second direction.

In example embodiments, the vertical memory device may further include a first bit lines, a second bit lines and a third bit lines electrically connected to respective channels.

In example embodiments, the first bit lines may be electrically connected to the first channels, the second bit lines may be electrically connected to the second channels or the third channels through the first conductive patterns, and the third bit lines may be electrically connected to the second channels or the third channels through the second conductive patterns.

In example embodiments, the first bit lines may overlap central portions of the first channels with respect to the first direction, the second bit lines may overlap central portions of the first conductive patterns with respect to the first direction, and the third bit lines may overlap central portions of the second conductive patterns with respect to the first direction.

In example embodiments, the first bit lines, the second bit lines and the third bit lines may extend in the second direction. The first bit lines, the second bit lines and the third bit lines may be arranged alternately and repeatedly in the third direction.

In example embodiments, the first bit lines, the second bit lines and the third bit lines may extend in a direction oblique to the second direction, and the first bit lines, the second bit lines and the third bit lines may be arranged alternately and repeatedly in the third direction.

According to example embodiments, there is provided a method of manufacturing a vertical memory device. In the method, a sacrificial layer and an insulation layer are formed on a substrate alternately and repeatedly. A plurality of holes is formed through the sacrificial layers and the insulation layers to expose a top surface of the substrate. The plurality of holes constitutes a hole array. A blocking layer pattern, a charge storage layer pattern, a tunnel insulation layer pattern and a channel are formed on a sidewall of each hole, sequentially. A plurality of gaps is formed by removing the sacrificial layers to expose a sidewall of each blocking layer pattern. A gate electrode is formed to fill each gap. Each of hole arrays includes a first hole column including a plurality of first holes disposed at a central portion of the first region with respect to a third direction substantially perpendicular to the first direction and the second direction, a second hole column including a plurality of second holes disposed at a outer portion of the first region, and a third hole column including a plurality of third holes disposed at the outer portion of the first region. The second holes are spaced apart from respective first holes in a fourth direction oblique to the third direction. The third holes are spaced apart from respective second holes in the second direction.

In example embodiments, a first conductive pattern is formed to electrically connect a channel in a second hole of one hole array with a channel in a third hole of another hole array. A second conductive pattern is formed to electrically connect a channel in a third hole of one hole array with a channel in a second hole of the other hole array.

BRIEF DESCRIPTION OF THE DRAWINGS

Example embodiments will be more clearly understood from the following detailed description taken in conjunction with the accompanying drawings.

FIGS. 1 to 5 are horizontal cross-sectional views, a vertical cross-sectional view, and a perspective view illustrating a vertical memory device in accordance with example embodiments;

FIGS. 6 to 19 are horizontal cross-sectional views, vertical cross-sectional views, and a perspective view illustrating a method of manufacturing a vertical memory device in accordance with example embodiments; and FIGS. 20 and 21 are a horizontal cross-sectional view and a vertical cross-sectional view illustrating a vertical memory device in accordance with example embodiments.

DETAILED DESCRIPTION

Figure 1:
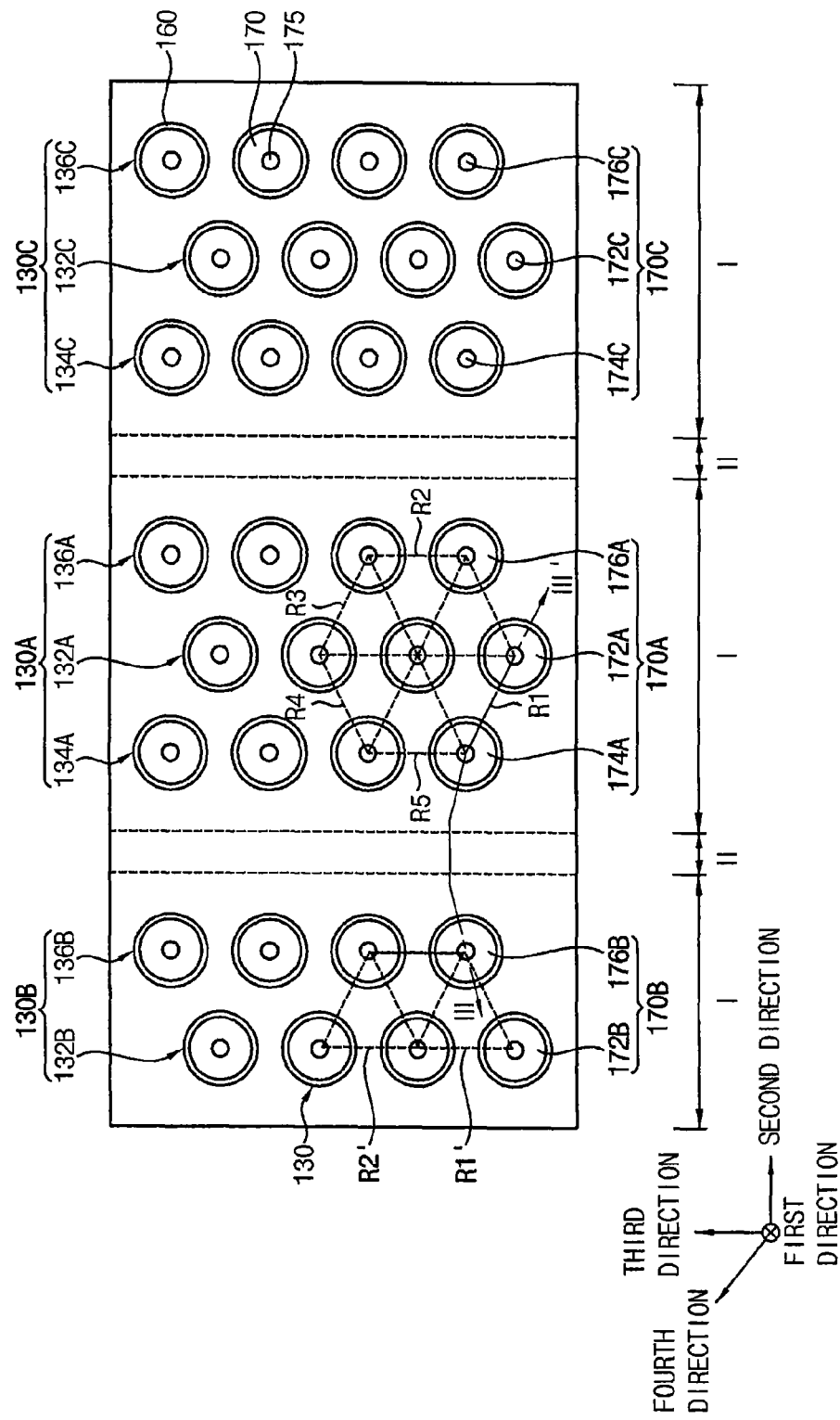
FIGS. 1 to 21 represent non-limiting, example embodiments as described herein.

Example embodiments will now be described more fully with reference to the accompanying drawings, in which example embodiments are shown. Example embodiments may, however, be embodied in many different forms and should not be construed as limited to the example embodiments set forth herein. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
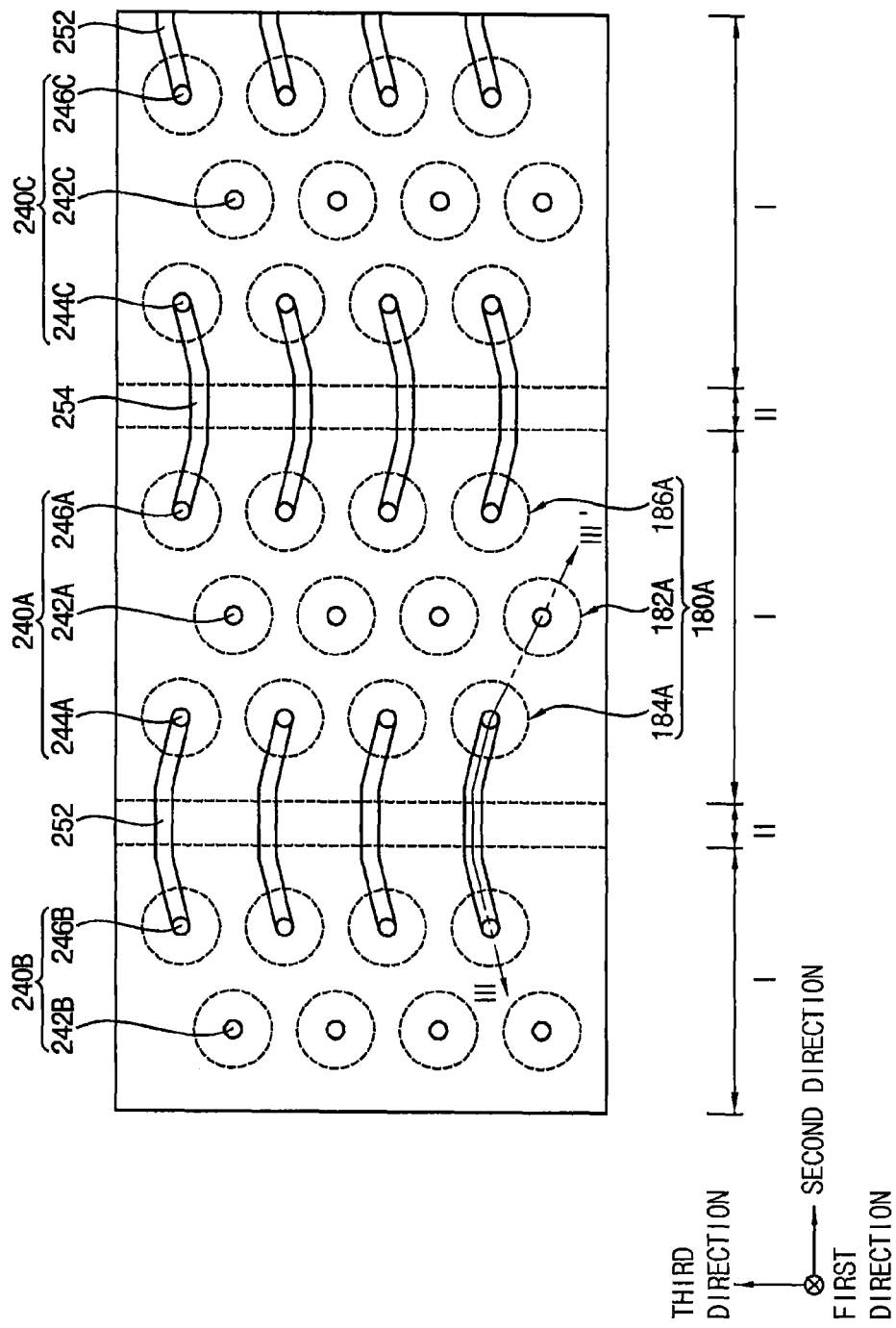
Figure 3:
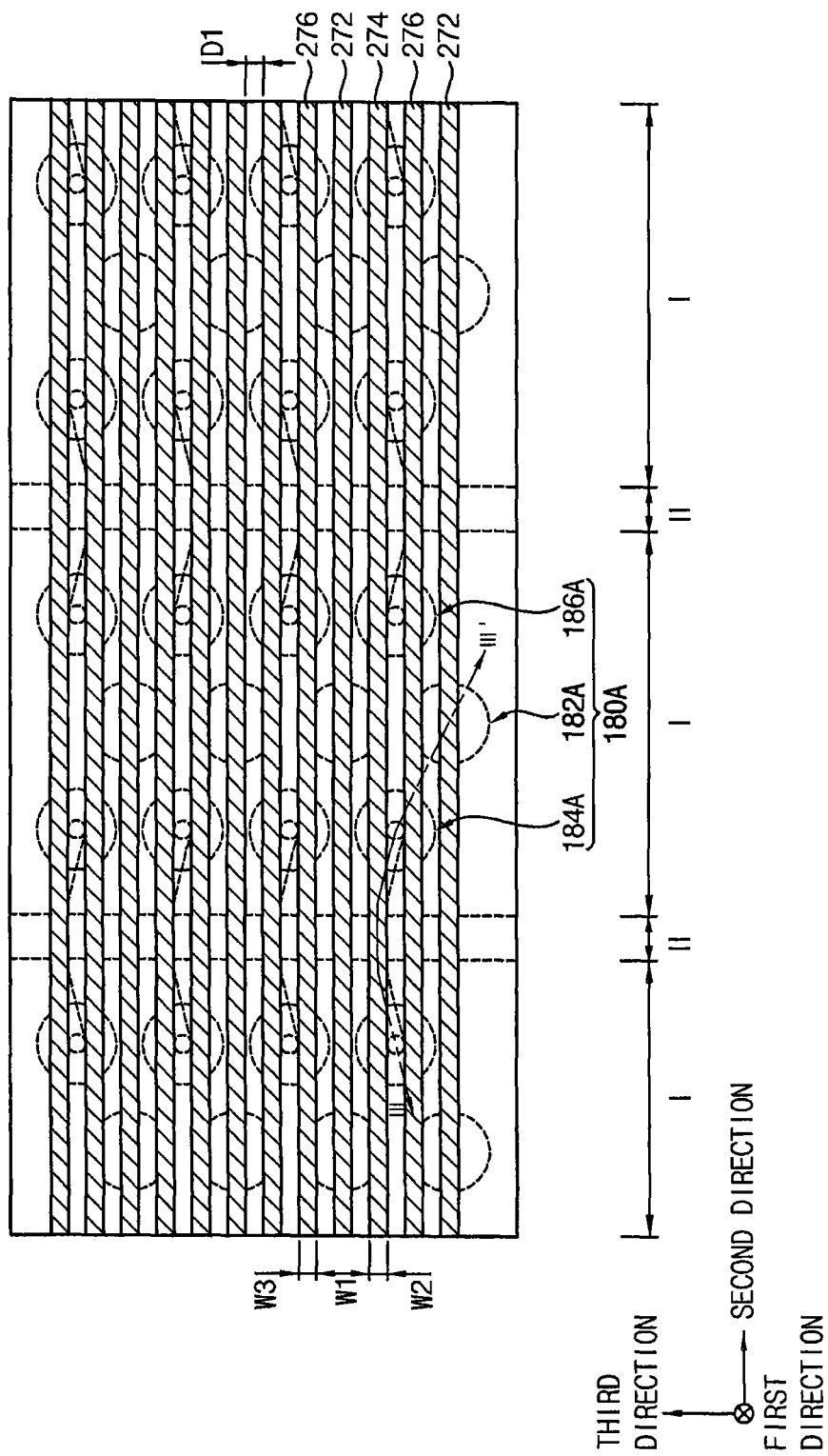
Figure 4:
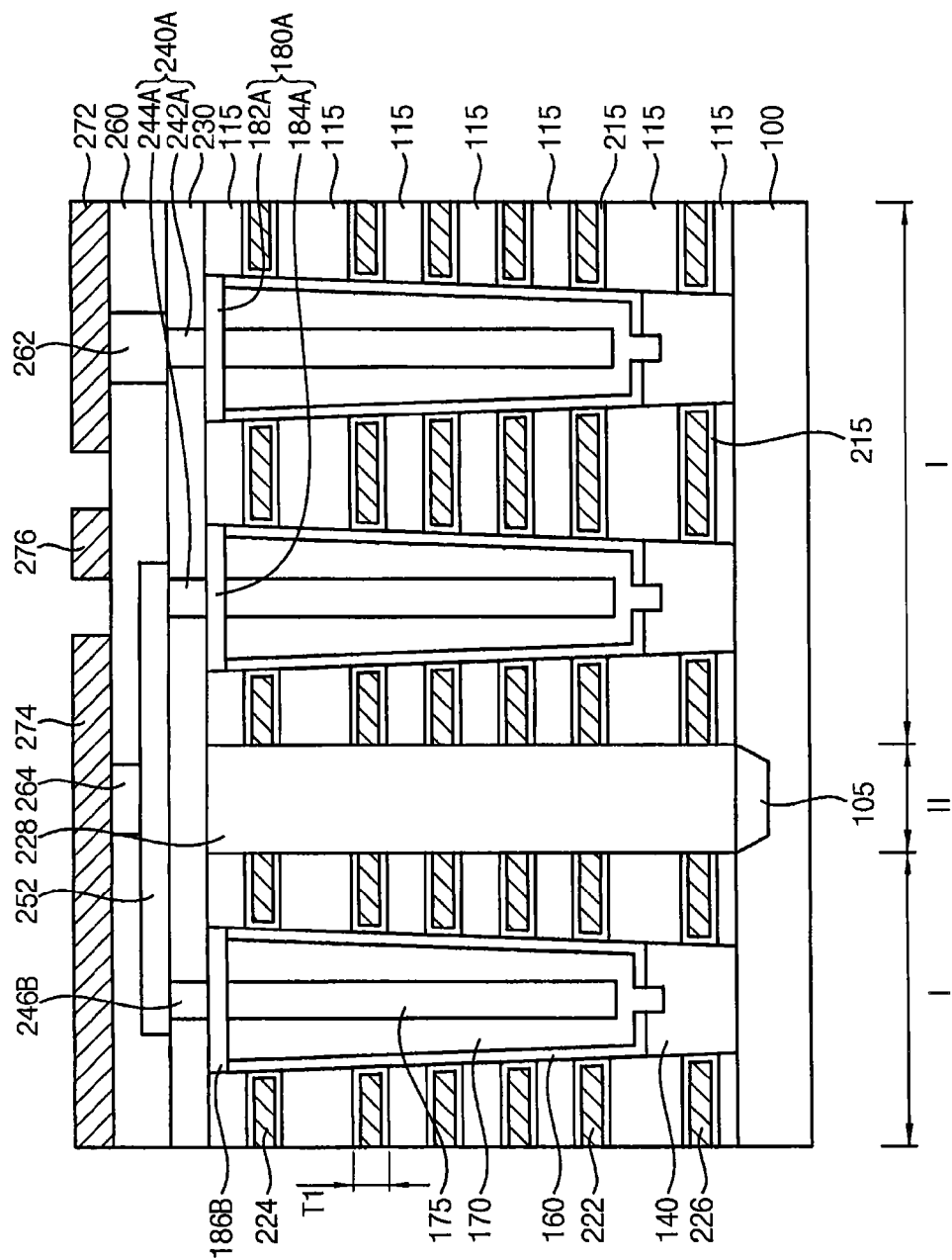
Figure 5:
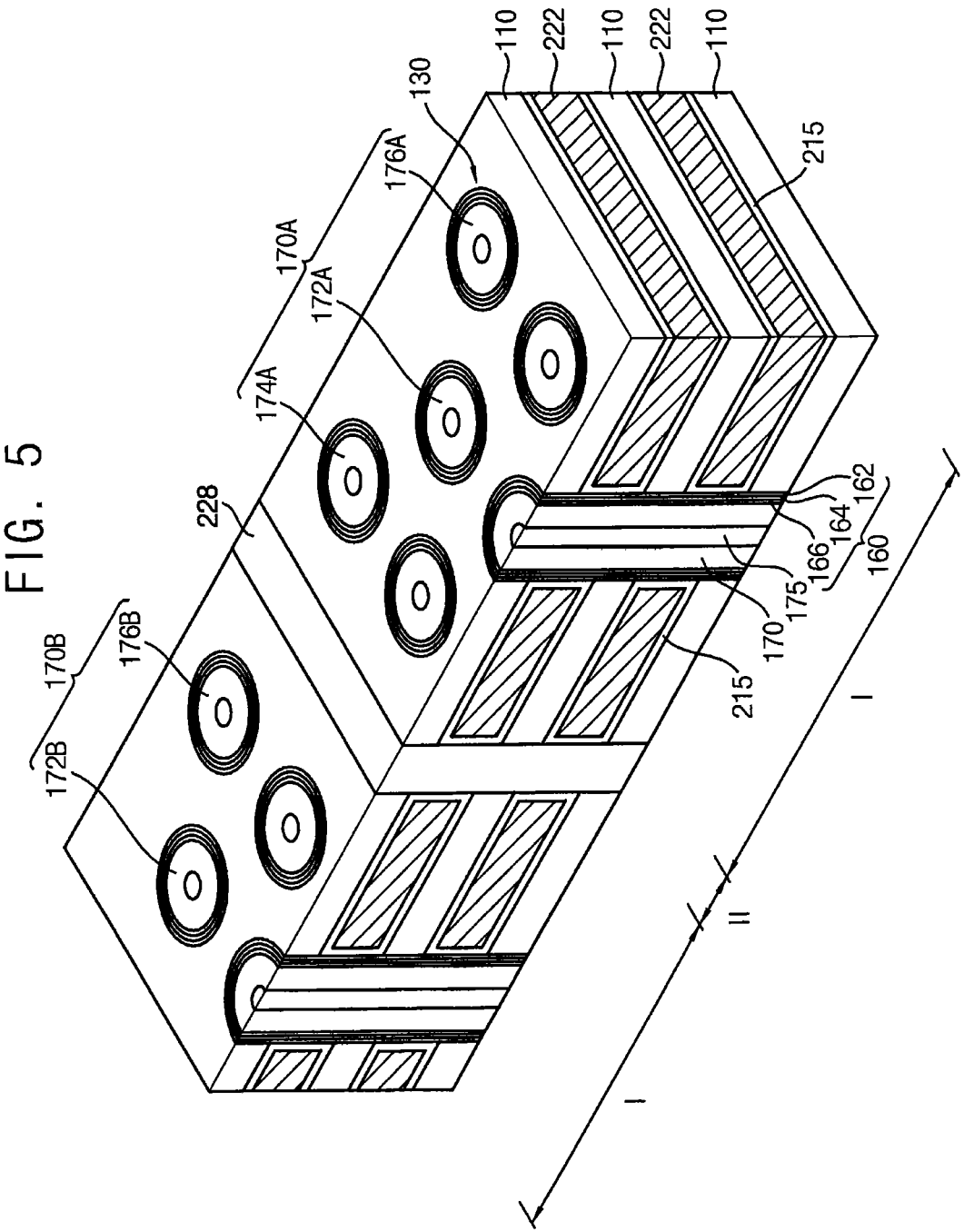

FIGS. 1 to 5 are horizontal cross-sectional views, a vertical cross-sectional view, and a perspective view illustrating a vertical memory device in accordance with example embodiments. Particularly, FIG. 1 is a horizontal cross-sectional view illustrating arrangements of holes and channels of the vertical memory device, FIG. 2 is a horizontal cross-sectional view illustrating arrangements of conductive patterns 252 and 254 of the vertical memory device, and FIG. 3 is a horizontal cross-sectional view illustrating arrangements of bit lines 272, 274 and 276 of the vertical memory device. Further, FIG. 4 is a vertical cross-sectional view cut along the line of the horizontal cross-sectional views and FIG. 5 is a perspective view illustrating memory cells of the vertical memory device.

In all figures in this specification, a direction substantially perpendicular to a top surface of the substrate is referred to as a first direction, and two directions substantially parallel to the top surface of the substrate and substantially perpendicular to each other are referred to as a second direction and a third direction. Further, a fourth direction is substantially parallel to the top surface of the substrate and at an acute angle to the third direction. Additionally, a direction indicated by an arrow in the figures and a reverse direction thereto are considered as the same direction.

Referring to FIGS. 1 to 5, the vertical memory device may include a plurality of channels 170 each of which may extend in the first direction on a substrate 100, a charge storage structure 160 stacked on an outer sidewall of each channel 170, and a plurality of gate electrodes 222, 224 and 226 disposed on an outer sidewall of the charge storage structure 160. The vertical memory device may further include the conductive patterns 252 and 254 and the bit lines 272, 274 and 276 electrically connected to each channel 170.

The substrate 100 may include a semiconductor material, e.g., silicon, germanium, etc. The substrate 100 may include a first region I and a second region II. In example embodiments, the first region I may be a cell region in which vertical memory elements including the channels 170 may be formed, and the second region II may be a word line cut region in which a third insulation layer pattern 228 may be disposed to insulate the gate electrodes 222, 224 and 226. A plurality of first regions I and a plurality of second regions II may be disposed alternately and repeatedly in the second direction, and each of the first regions I and the second regions II may extend in the third direction.

Each channel 170 may extend in the first direction in the first region I. In some example embodiments, each channel 170 may have a cup shape of which a central bottom is opened. In this case, a space defined by an inner wall of each channel 170 may be filled with an insulation pattern (not shown). In other example embodiments, each channel 170 may have a pillar shape. For example, each channel 170 may include doped or undoped polysilicon or single crystalline silicon.

In example embodiments, the plurality of channels 170 may be arranged in both of the second and third directions, and thus a plurality of channel arrays 170A, 170B and 170C may be defined. Each of the channel arrays 170A, 170B and 170C may include a plurality of channel columns, and each of the channel columns may include a plurality of channels 172A, 172B, 172C, 174A, 174C, 176A, 176B and 176C which may be arranged in the third direction.

For example, a first channel array 170A may include a first channel column, a second channel column, and a third channel column. The first channel column may include a plurality of first channels 172A that may be arranged in the third direction, the second channel column may include a plurality of second channels 174A that may be arranged in the third direction, and the third channel column may include a plurality of third channels 176A that may be arranged in the third direction.

In example embodiments, the first channels 172A may be arranged at a central portion of the first region I in the third direction, and the second channels 174A and the third channels 176A may be arranged at outer portions of the first region I in the third direction. Further, the second channels 174A may be spaced apart from the first channels 172A in the fourth direction, and the third channels 176A may be spaced apart from the second channels 174A in the second direction. Accordingly, the first, second and third channels 172A, 174A and 176A may be arranged in a zigzag pattern (that is, a staggered pattern) with respect to the second direction, and thus more channels may be arranged in a given area.

On the other hand, single channel array may be disposed in respective single first region I. In example embodiments, three channel columns may be disposed in the respective single first region I. As the number of the channel columns is limited to three, a void may not be occurred during a process for forming a gate electrode layer.

Each of the channels 170 may be disposed in each of holes 130. As the plurality of channels 170 may constitute the channel arrays 170A, 170B, and 170C, a plurality of holes 130 may also constitute hole arrays 130A, 130B, and 130C. In example embodiments, each of the hole array may include three hole columns. For example, a first hole array 130A may include a first hole column, a second hole column and a third hole column, and each of the hole columns may include a plurality of holes 132A, 134A and 136A, respectively.

Referring to FIGS. 3 and 4, the charge storage structure 160 disposed on the outer sidewall of each channel 170 may include a tunnel insulation layer pattern 166, a charge storage layer pattern 164 and a first blocking layer pattern 162 which may be stacked sequentially. Particularly, the tunnel insulation layer pattern 166, the charge storage layer pattern 164 and the first blocking layer pattern 162 may surround the outer sidewall and a bottom surface of each channel 170. In example embodiments, a plurality of charge storage structures 160 may be disposed to correspond to respective channels 170.

In example embodiments, the tunnel insulation layer pattern 166 may include an oxide, e.g., silicon oxide, the charge storage layer pattern 164 may include a nitride, e.g., silicon nitride, and the first blocking layer pattern 162 may include an oxide, e.g., silicon oxide.

On the other hand, a semiconductor pattern 140 making contact with the top surface of the substrate 100 may be formed beneath each channel 170. According as the channel 170 may have the portion at a bottom thereof protruding from the charge storage layer structure 160, the semiconductor pattern 140 may have a concave portion at a top surface thereof. That is, the semiconductor pattern 140 may directly contact the channel 170 through the protrusion portion thereof. In example embodiments, the semiconductor pattern 140 may include doped or undoped polysilicon, single crystalline polysilicon, doped or undoped polygermanium or single crystalline germanium.

Additionally, a pad 180 may be formed on top surfaces of the channel 170 and the charge storage layer structure 160. In example embodiments, the pad 180 may include doped or undoped polysilicon or single crystalline silicon.

As the plurality of channels 170 may constitute the channel arrays 170A, 170B, and 170C, a plurality of pads 180 may also constitute pad arrays. In example embodiments, each of the pad arrays may include three pad columns. For example, a first pad array 180A may include a first pad column, a second pad column and a third pad column, and each of the pad columns may include a plurality of pads 182A, 184A and 186A, respectively.

A plurality of first insulation patterns 115 may be formed in the first direction on sidewalls of the first blocking layer patterns 162, respectively. For example, each first insulation pattern 115 may include silicon oxide. Further, a space between the first insulation layers 115 at each level may be defined as a gap.

A minimum distance between the first insulation layers 115 at each level in the first direction may be defined as a first distance T1. In example embodiments, the first distance T1 may be less than about 30 nm. Particularly, the first distance T1 may be in a range of about 20 nm to about 25 nm. As the first distance T1 decrease, a total height of the vertical memory device may also decrease. Therefore, the degree of integration of the vertical memory device in a predetermined volume may increase.

The second blocking layer pattern 215 may surround a sidewall of the first blocking layer pattern 162 exposed by the gap, that is, may surround an outer sidewall of the channel 170. Thus, portions of the outer sidewalls of the channels 170 may be surrounded by the second blocking layer pattern 215. The second blocking layer pattern 215 may be further formed on an inner wall of the gap. Top and bottom end portions of the second blocking layer pattern 215 may extend in both of the second and third directions. The second blocking layer pattern 215 may include, e.g., aluminum oxide and/or silicon oxide.

The plurality of gate electrodes 222, 224 and 226 may be formed on a sidewall of the second blocking layer pattern 215 and may fill an inner portion of the gap. In example embodiments, the plurality of gate electrodes 222, 224 and 226 may extend in the third direction.

The plurality of gate electrodes 222, 224 and 226 may include a ground selection line (GSL) 226, a word line 222 and a string selection line (SSL) 224 that are spaced apart from each other along the first direction.

Each of the GSL 226, the word line 222 and the SSL 224 may be at a single level (e.g., one of each, each at a different height) or more than one level, and each of the first insulation layer patterns 115 may be interposed therebetween. In an example embodiments, the GSL 226 and the SSL 224 may be at one level (e.g., two of each at different heights), respectively, and the word line 222 may be at 4 levels between the GSL 226 and the SSL 224. However, the GSL 226 and the SSL 224 may be at two levels, and the word line 222 may be formed at 2, 8 or 16 levels.

In example embodiments, the plurality of gate electrodes 222, 224 and 226 may include, for example, a metal and/or a metal nitride. For example, the plurality of gate electrodes 222, 224 and 226 may include a metal and/or a metal nitride with low electrical resistance (e.g., tungsten, tungsten nitride, titanium, titanium nitride, tantalum, tantalum nitride and/or platinum.)

The plurality of gate electrodes 222, 224 and 226 may be arranged in the second direction. Particularly, the plurality of gate electrodes 222, 224 and 226 may be divided by a third insulation layer pattern 228.

Accordingly, the channel 170, the charge storage layer structure 160 and the plurality of gate electrodes 222, 224 and 226 may define a gate structure. A plurality of gate structures may be formed in the first direction.

Referring now to FIGS. 2 and 4, some channels of one channel array may be electrically connected to other channels of another channel array through the conductive patterns 252 and 254.

Particularly, a fourth insulation layer 230 may be formed on the first insulation layer pattern 115 and the pads 180. Contacts 240 may be formed through the fourth insulation layer 230, thereby contacting the pads 180. Some contacts 240 may be electrically connected to each other through the first and second conductive patterns 252 and 254.

In example embodiments, a plurality of contacts 240 may be arranged in the second direction and the third direction. Therefore, the plurality of contacts 240 may define a plurality of contact arrays 240A, 240B and 240C. Each of the contact arrays 240A, 240B and 240C may include a plurality of contact columns, and each of the contact columns may include the plurality of contacts 240 arranged in the third direction.

For example, the first contact array 240A may include a first contact column including a plurality of first contacts 242A, a second contact column including a plurality of second contacts 244A and a third contact column including a plurality of third contact 246A. Each of the first to third contacts 242A, 244A and 246A may be electrically connected to each of the first to third channels 172A, 174A and 176A through respective pads 180.

The first conductive patterns 252 and the second conductive patterns 254 may be disposed on the fourth insulation layer 230. The first conductive patterns 252 and the second conductive patterns 254 may electrically connect the second contacts 244A, 244C with third contacts 246A, 246B and 246C. For example, the first conductive patterns 252 may electrically connect the second contacts 244A of the first contact array 240A with the third contacts 246B of the second contact array 240B, and the second conductive pattern 254 may electrically connect the third contacts 246A of the first contact array 240A with the second contacts 244C of the third contact array 240C as illustrated in FIG. 1. Further, the first contacts 242A, 242B and 242C may be electrically isolated from the first conductive pattern 252 and the second conductive pattern 254.

In example embodiments, a plurality of first conductive patterns 252 and a plurality of second conductive patterns 254 may be arranged in the third direction.

Further, the first conductive pattern 252 and the second conductive pattern 254 may be curved in opposite directions. For example, a central portion of the first conductive pattern 252 may be curved in the third direction, and a central portion of the second conductive pattern 254 may be curved in a direction as opposed to the third direction. Therefore, the central portion of the first conductive pattern 252 may not overlap the central portion of the second conductive pattern 254 with respect to the second direction.

In example embodiments, the first conductive pattern 252 and the second conductive pattern 254 may include a metal, a conductive metal nitride, doped polysilicon, and the like.

Referring now to FIGS. 3 and 4, the bit lines 272, 274 and 276 may be electrically connected to the channels 170 and the pads 180 through the bit line contacts 262, 264 and 266.

In example embodiments, each of the bit lines 272, 274 and 276 may extend in the second direction. The bit lines 272, 274 and 276 may be arranged in the third direction. Particularly, the first bit line 272, the second bit line 274 and the third bit line 276 may be arranged in the third direction alternately and repeatedly. Further, the first to third bit lines 272, 274 and 276 may have the same width W1, W2 and W3 in the third direction, and may be spaced apart from one another by the same distance D1.

The bit line contacts 262, 264 and 266 may be disposed through a fifth insulation layer 260. For example, the bit line contacts 262, 264 and 266 may include a metal, a conductive metal nitride, doped polysilicon, and the like.

In example embodiments, the first bit line contacts 262 may electrically connect the first contacts 242A, 242B and 242C with the first bit lines 272. Therefore, the first bit lines 272 may be electrically connected to the first channels 172A, 172B and 172C. The second bit lines contact 264 may be electrically connected to the first conductive pattern 252 and the second bit lines 274. Therefore, the second bit lines 274 may be electrically connected to the second channels 174A of the first channel array 170A and the third channels 176B of the second channel array 170B.

The third bit lines contact 266 may be electrically connected to the second conductive pattern 255 and the third bit lines 276. Therefore, the third bit lines 276 may be electrically connected to the third channels 176A of the first channel array 170A and the second channels 174B of the second channel array 170B. Accordingly, the first channel, the second channel and the third channel of one channel array may be electrically connected to different bit lines, respectively.

The first conductive pattern 252 and the second conductive pattern 254 may be curved in opposite directions, so that the second bit line 274 and the third bit line 276 electrically connected to the first and second conductive patterns 252 and 254 respectively, may be spaced apart from the first bit line 272 by a predetermined distance. Accordingly, the vertical memory device may have a reduced width in the third direction, so that the degree of integration may increase.

According to example embodiment, the vertical memory device may include the plurality of channels, and the plurality of channels may constitute the channel array including three channel columns. The channels may be electrically connected to the first to third bit lines 172m 174 and 176 through the first conductive pattern 151 or the second conductive pattern 154. The first conductive pattern 252 and the second conductive pattern 254 may be curved in opposite directions, so that the first to third bit lines 272, 274 and 276 may be spaced apart from each other by the predetermined distance. Therefore, the degree of integration of the vertical memory device may increase.

Moreover, as illustrated best by FIGS. 1, 4 and 5, non-volatile memory devices according to some embodiments of the invention can include at least four cylindrical-shaped channel regions 170, which extend vertically from portions of a substrate 100 located at respective vertices of at least one rhomboid when viewed in a vertical direction relative to a surface of the substrate 100. As shown by the dotted lines in the plan view of FIG. 1, the channel regions 170 are centered at vertices of respective rhomboids (e.g., R1, R2, R3, R4 and R5; and R1', R2')—when viewed in a vertical direction relative to an upper surface of the substrate 100. In addition, a charge storage layer 160 (e.g., ONO layer) is provided on an outer sidewall of each of the cylindrical-shaped channel regions 170. To achieve a high degree of integration, a plurality of vertically-stacked gate electrodes 222 are provided, which extend adjacent each of the cylindrical-shaped channel regions 170.

FIGS. 6 to 19 are horizontal cross-sectional views, vertical cross-sectional views, and a perspective view illustrating a method of manufacturing a vertical memory device in accordance with example embodiments. The figures show methods of manufacturing the vertical memory device of FIGS. 1 to 3, however, may not be limited thereto.

Figure 6:
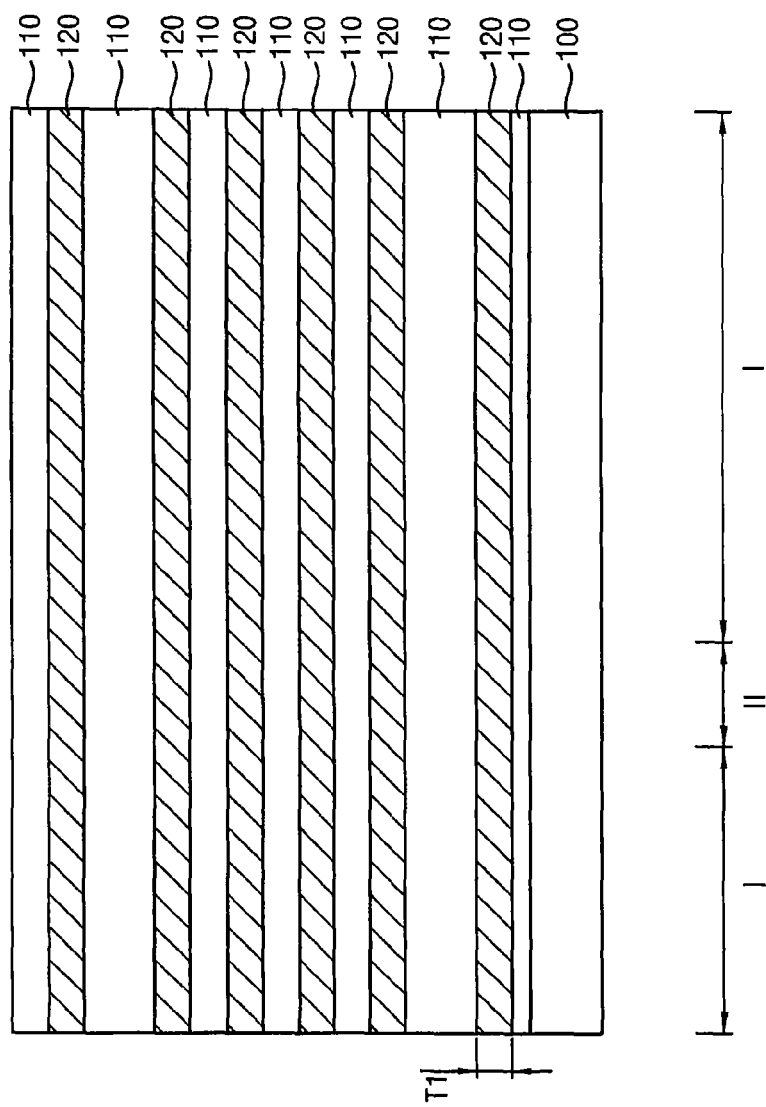

Referring to FIG. 6, a first insulation layer 110 and a sacrificial layer 120 may be alternately and repeatedly formed on a substrate 100. A plurality of first insulation layers 110 and a plurality of sacrificial layers 120 may be alternately formed on each other at a plurality of levels, respectively.

The substrate 100 may include a semiconductor material, for example, silicon and/or germanium. The substrate 100 may be divided into a first region I and a second region II. In example embodiments, the first region I and the second region II may be arranged alternately and repeatedly in the second direction.

In example embodiments, the first insulation layer 110 and the sacrificial layer 120 may be formed by, for example, a chemical vapor deposition (CVD) process, a plasma enhanced chemical vapor deposition (PECVD) process and/or an atomic layer deposition process (ALD) process. A lowermost first insulation layer 110, which may be formed directly on a top surface of the substrate 100, may be formed by, for example, a thermal oxidation process. In example embodiments, the first insulation layer 110 may be formed to include a silicon oxide. The sacrificial layers 120 may be formed to include, for example, a material with etch selectivity to the first insulation layer 110 (e.g., silicon nitride).

Figure 14:
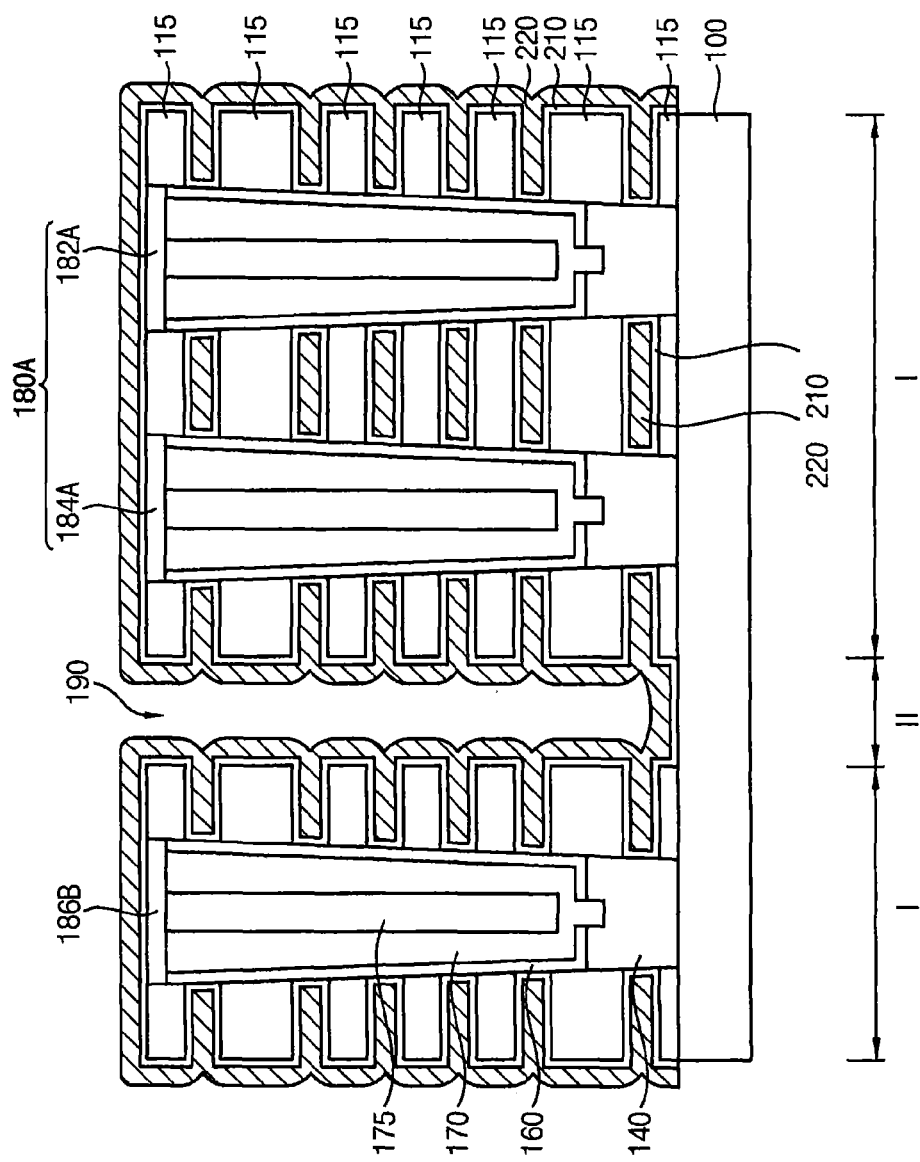
Figure 15:
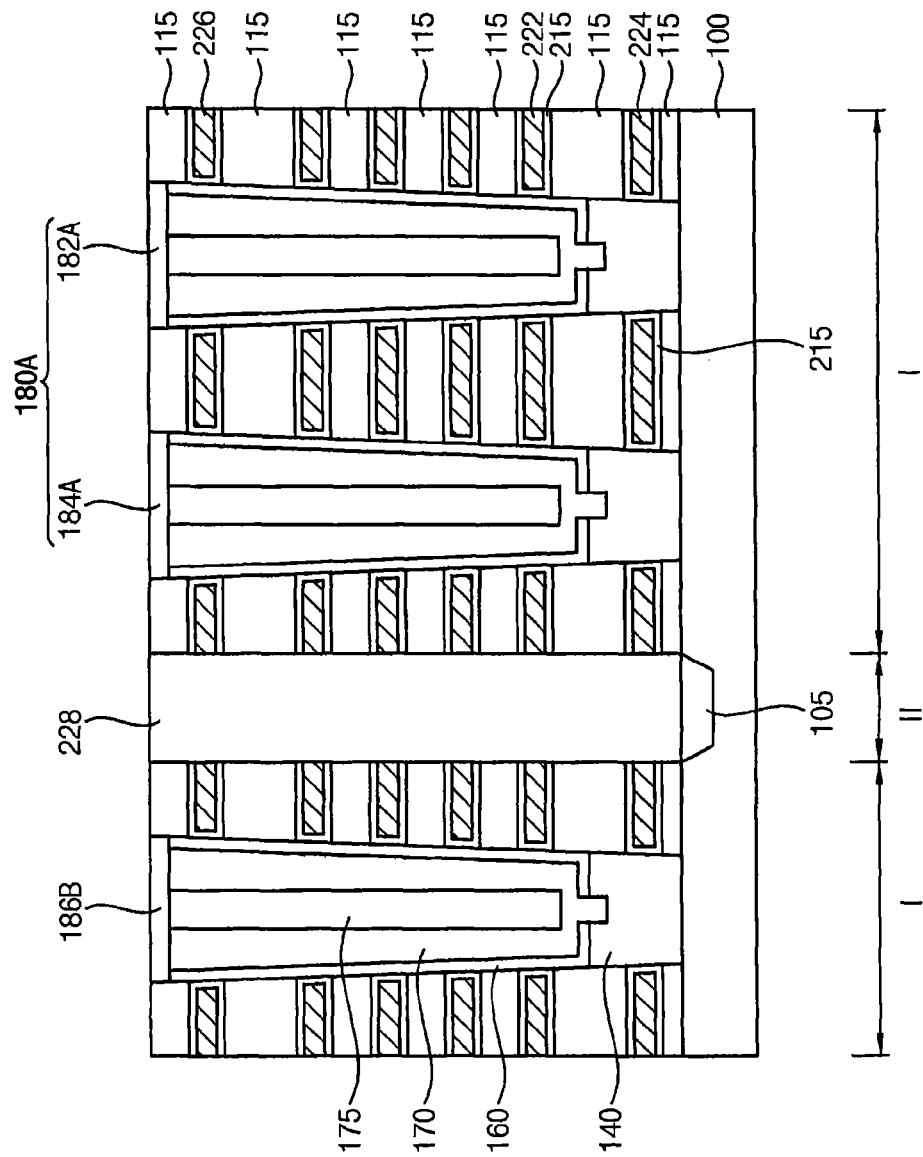

The number of the first insulation layers 110 and the number of the sacrificial layers 120 stacked on the substrate 100 may vary according to the desired number of a GSL 226, a word line 222 and a SSL 224 (refer to FIG. 14). According to at least one example embodiments, each of the GSL 226 and the SSL 224 may be formed at a single level, and the word line 222 may be formed at 4 levels. The sacrificial layer 120 may be formed at 6 levels, and the first insulation layer 110 may be formed at 7 levels. According to at least one example embodiments, each of the GSL 226 and the SSL 224 may be formed at two levels, and the word line 222 may be formed at 2, 8 or 16 levels. The number of the first insulation layers 110 and the number of the sacrificial layers 120 may vary according to this case. However, the number of GSLs 226, SSLs 224 and word lines 222 may not be limited herein.

Further, each of the sacrificial layers 120 may have a thickness substantially the same as a first distance T1. In example embodiments, the first distance T1 may be less than about 30 nm. Particularly, the first distance T1 may be in a range of about 20 nm to about 25 nm. As the first distance T1 decrease, a total height of the vertical memory device may also decrease.

Figure 7:
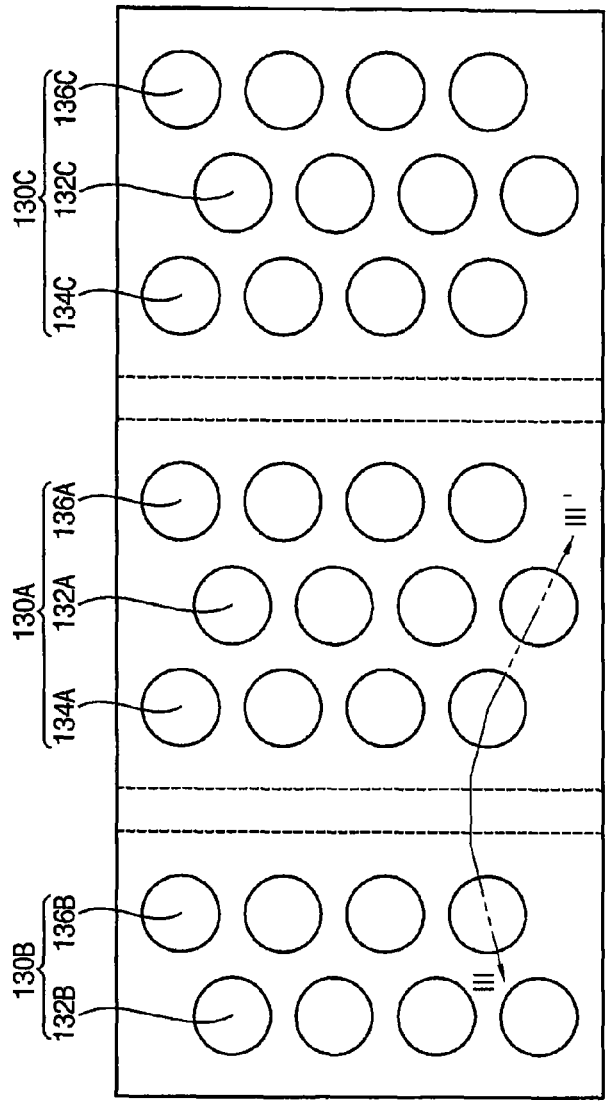
Figure 8:
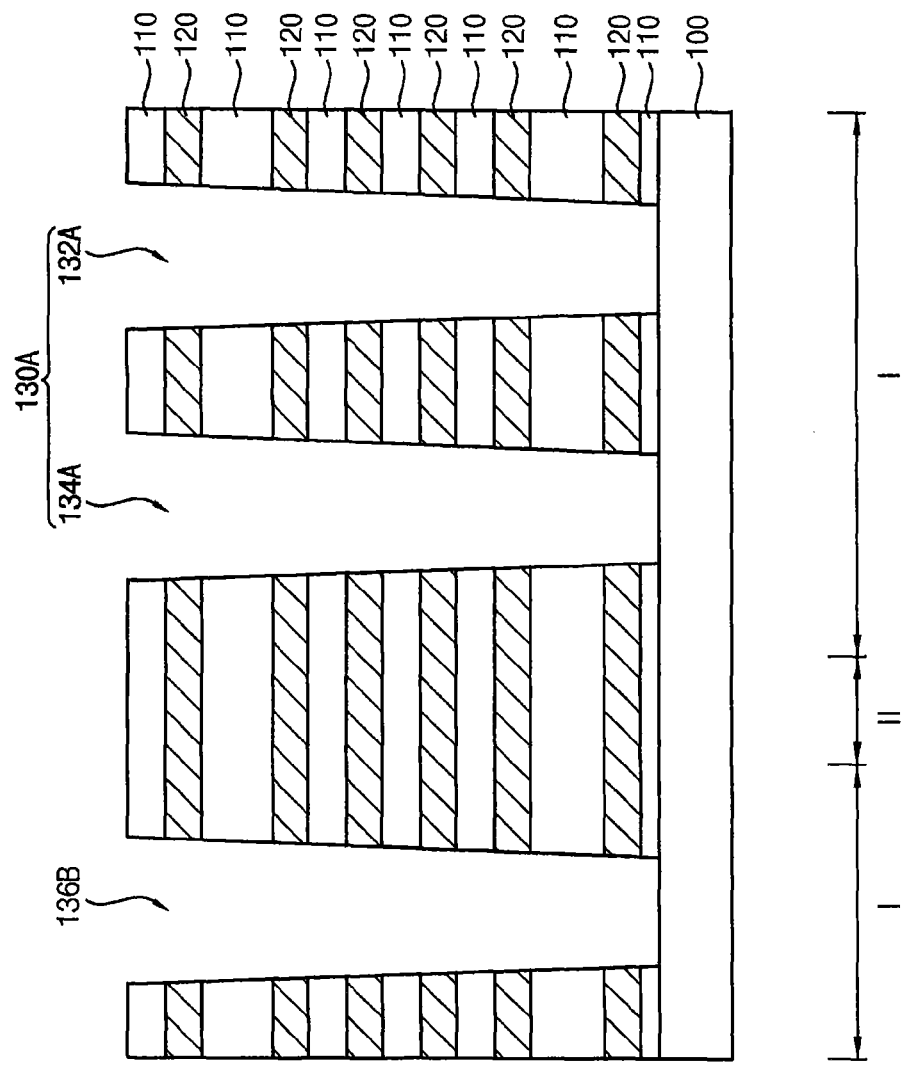

Referring to FIGS. 7 and 8, a plurality of holes 130 may be formed through the first insulation layers 110 and the sacrificial layers 120 to expose a top surface of the substrate 100.

In example embodiments, after forming a hard mask on the uppermost first insulation layer 110, the first insulation layers 110 and the sacrificial layers 120 may be dry etched using the hard mask as an etch mask to form the holes 130. As the sacrificial layers 120 may have the thickness of the first distance T1 decrease, a total height of the vertical memory device may also decrease. Therefore, an aspect ratio of the holes 130 also may decrease. Accordingly, an etching process for forming the holes 130 may be performed reliability and easily.

In example embodiments, a plurality of holes 130 may arranged in the second direction and the third direction. Therefore, the plurality of holes 130 may constitute hole arrays 130A, 130B and 130C. For example, the plurality of holes 130 may be arranged in a zigzag pattern with respect to the third direction.

Each of the hole arrays 130A, 130B and 130C may include the plurality of hole columns, and each of hole columns may include the plurality of holes arranged in the third direction. In example embodiments, each of the hole arrays 130A, 130B and 130C may include three hole columns.

For example, the first hole array 130A may include a first hole column including a plurality of first holes 132A, a second hole column including a plurality of second holes 134A and a third hole column including a plurality of third holes 136A. As illustrated in FIG. 7, the first holes 132A may be arranged at a central portion of the first region I in the third direction, and the second holes 134A and the third holes 136A may be arranged at outer portions of the first region I in the third direction. Further, the second holes 134A may be spaced apart from the first holes 132A in the fourth direction, and the third holes 136A may be spaced apart from the holes 134A in the second direction.

Figure 9:
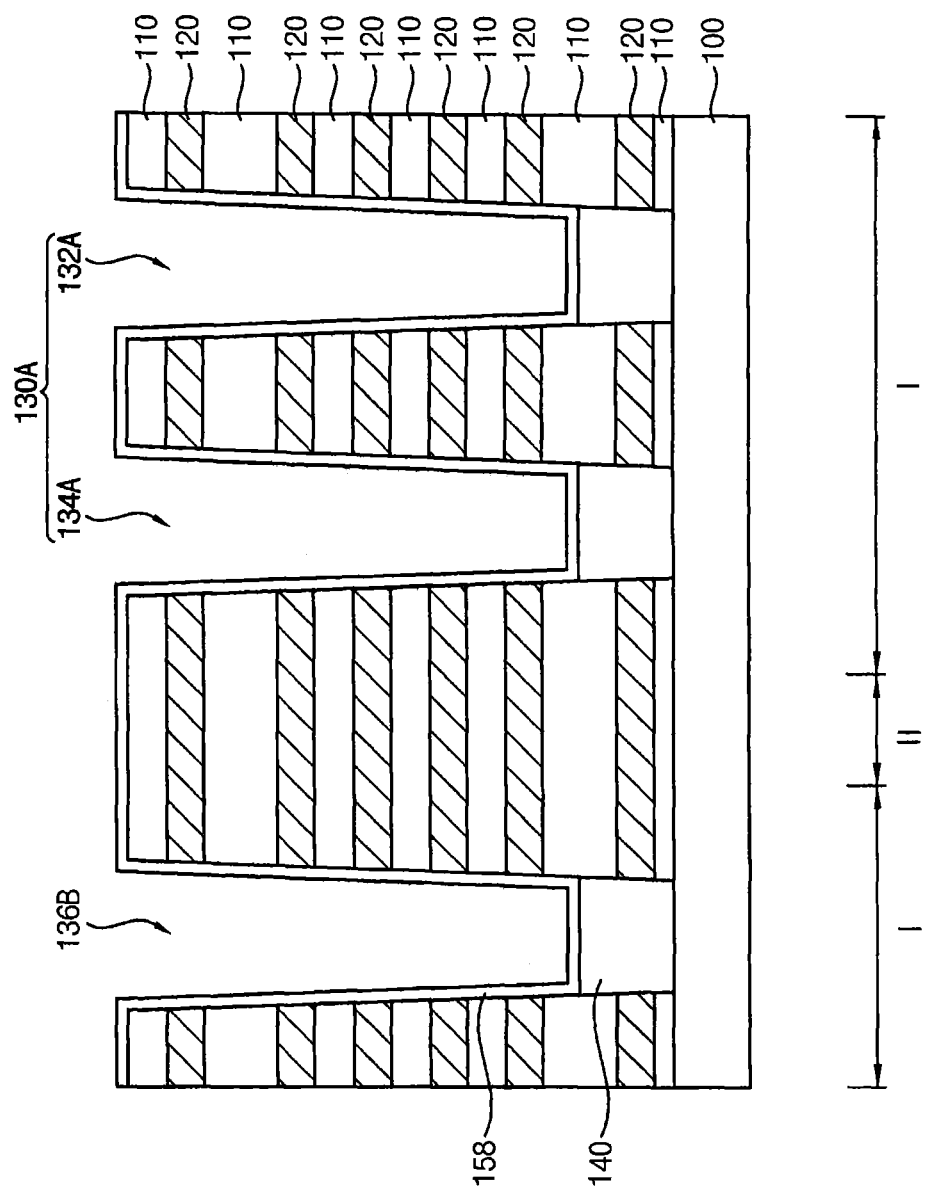

Referring to FIG. 9, a semiconductor pattern 140 may be formed to partially fill each hole 130, and a preliminary charge storage layer structure 158 may be formed an inner wall of each hole 130.

Particularly, a selective epitaxial growth (SEG) process may be performed using the exposed top surface of the substrate 100 as a seed to form the semiconductor pattern 140. Thus, the semiconductor pattern 140 may be formed to include single crystalline silicon or single crystalline germanium according to the material of the substrate 100, and in some cases, impurities may be doped thereinto. Alternatively, an amorphous silicon layer may be formed to fill the holes 130, and a laser epitaxial growth (LEG) process or a solid phase epitaxial (SPE) process may be performed on the amorphous silicon layer to form the semiconductor pattern 140. In example embodiments, the semiconductor pattern 140 may be formed to have a top surface higher than that of the sacrificial layer 120, in which the GSL 226 (See FIG. 14) may be formed subsequently.

Then, a first blocking layer, a charge storage layer and a tunnel insulation layer may be sequentially formed on an inner wall of the holes 130, a top surface of the semiconductor pattern 140, and a top surface of the hard mask. The first blocking layer, the charge storage layer and the tunnel insulation layer may constitute the preliminary charge storage layer structure 158.

In example embodiments, the first blocking layer may be formed to include an oxide, e.g., silicon oxide, the charge storage layer may be formed to include a nitride, e.g., silicon nitride, and the tunnel insulation layer may be formed to include an oxide, e.g., silicon oxide.

As the holes 130 has a reduced aspect ratio, the first blocking layer, the charge storage layer and the tunnel insulation layer may be formed on the inner wall of the holes 130 conformally.

Figure 10:
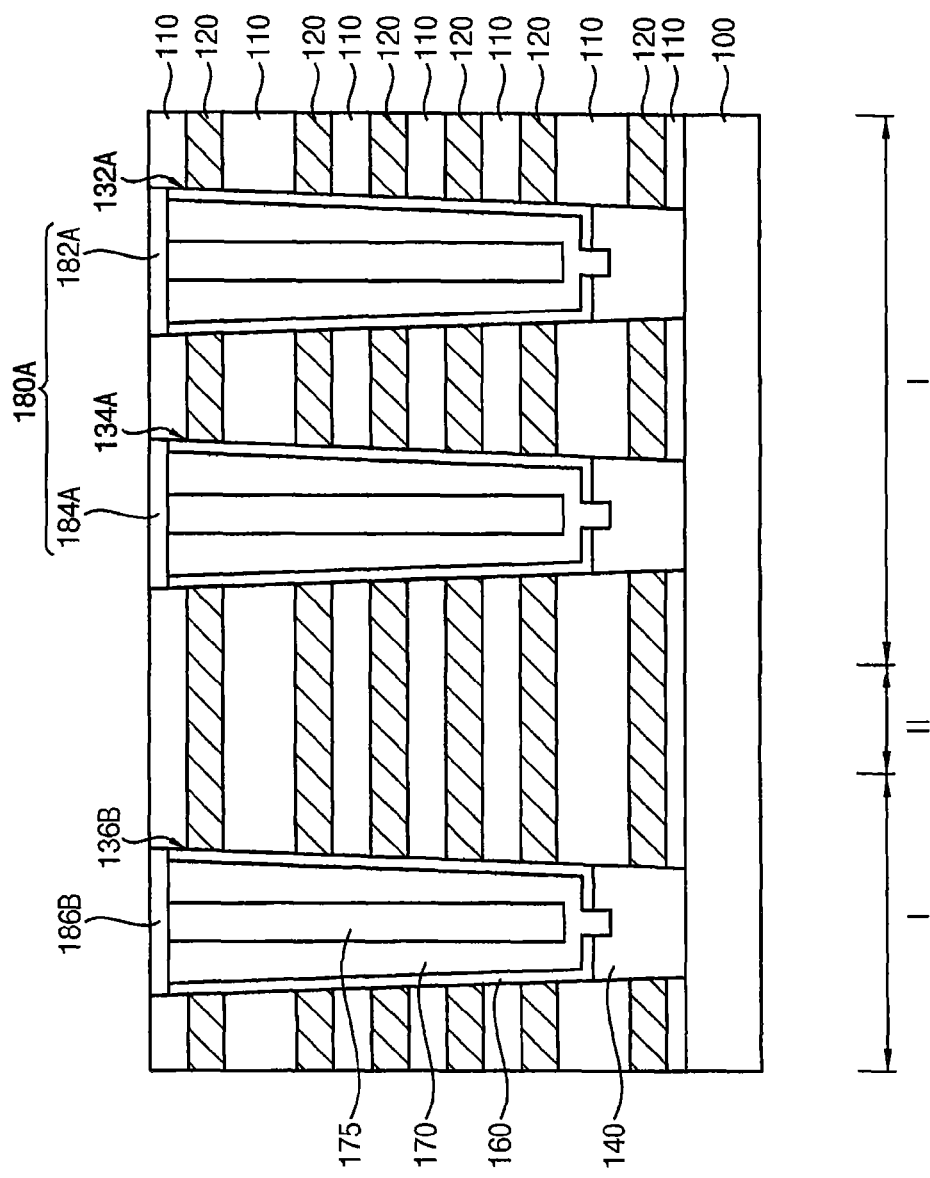
Figure 11:
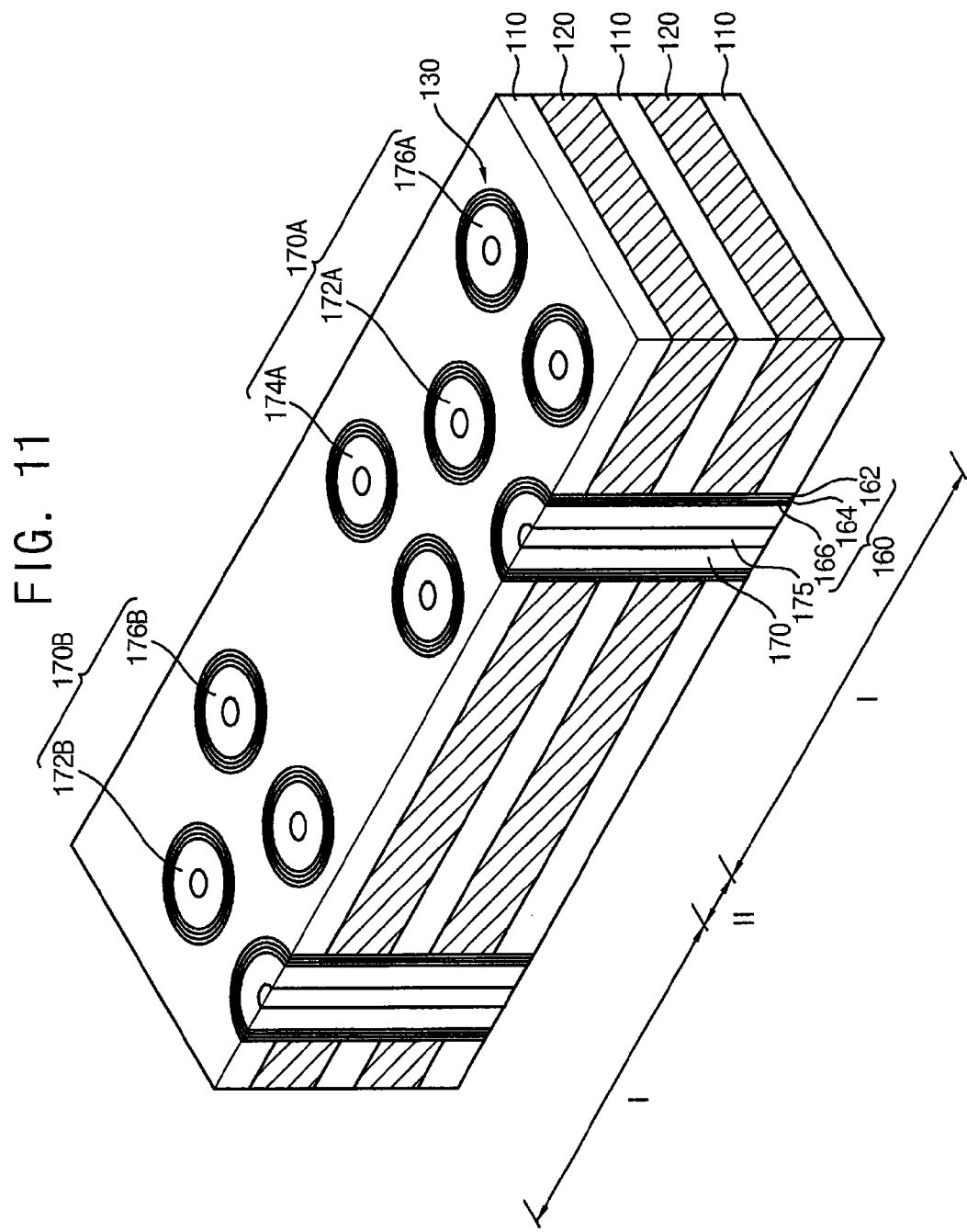

Referring to FIGS. 10 and 11, channels 170, second insulation layer patterns 175 and pads 180 may be formed to fill the holes 130.

Particularly, a bottom surface of the preliminary charge storage layer structure 158 and an upper portion of the semiconductor pattern 140 may be partially removed to form a first recess. A channel layer and a second insulation layer may be formed to sufficiently fill the first recess and a remaining portion of each hole 130, and then upper portions of the preliminary charge storage layer structure 158, the channel layer and the second insulation layer on the top surface of the uppermost first insulation layer 110 may be removed to form the charge storage layer structure 160, the channels 170 and the second insulation layer patterns 175. Therefore, the charge storage layer structure 160 may include a first blocking layer pattern 162, a charge storage layer pattern 164 and a tunnel insulation layer pattern 166.

In example embodiments, a plurality of channels may constitute channel arrays. For example, a first channel array 170A may include a first channel column including a plurality of first channels 172A, a second channel column including a plurality of second channels 174A, and a third channel column including a plurality of third channels 176A.

Then, upper portions of the first blocking layer pattern 162, the charge storage layer pattern 164, the tunnel insulation layer pattern 166, the channels 170 and the second insulation layer patterns 172 may be partially removed to form a second recess, and the pad 180 may be formed to fill the second recess. For example, the pad 180 may include a metal, a conductive metal nitride, doped polysilicon, and the like.

In example embodiments, a plurality of pads may constitute pad arrays. For example, a first pad array 180A may include a first pad column including a plurality of first pads 182A, a second pad column including a plurality of second pads 184A, and a third pad column including a plurality of third pads 186A.

Figure 12:
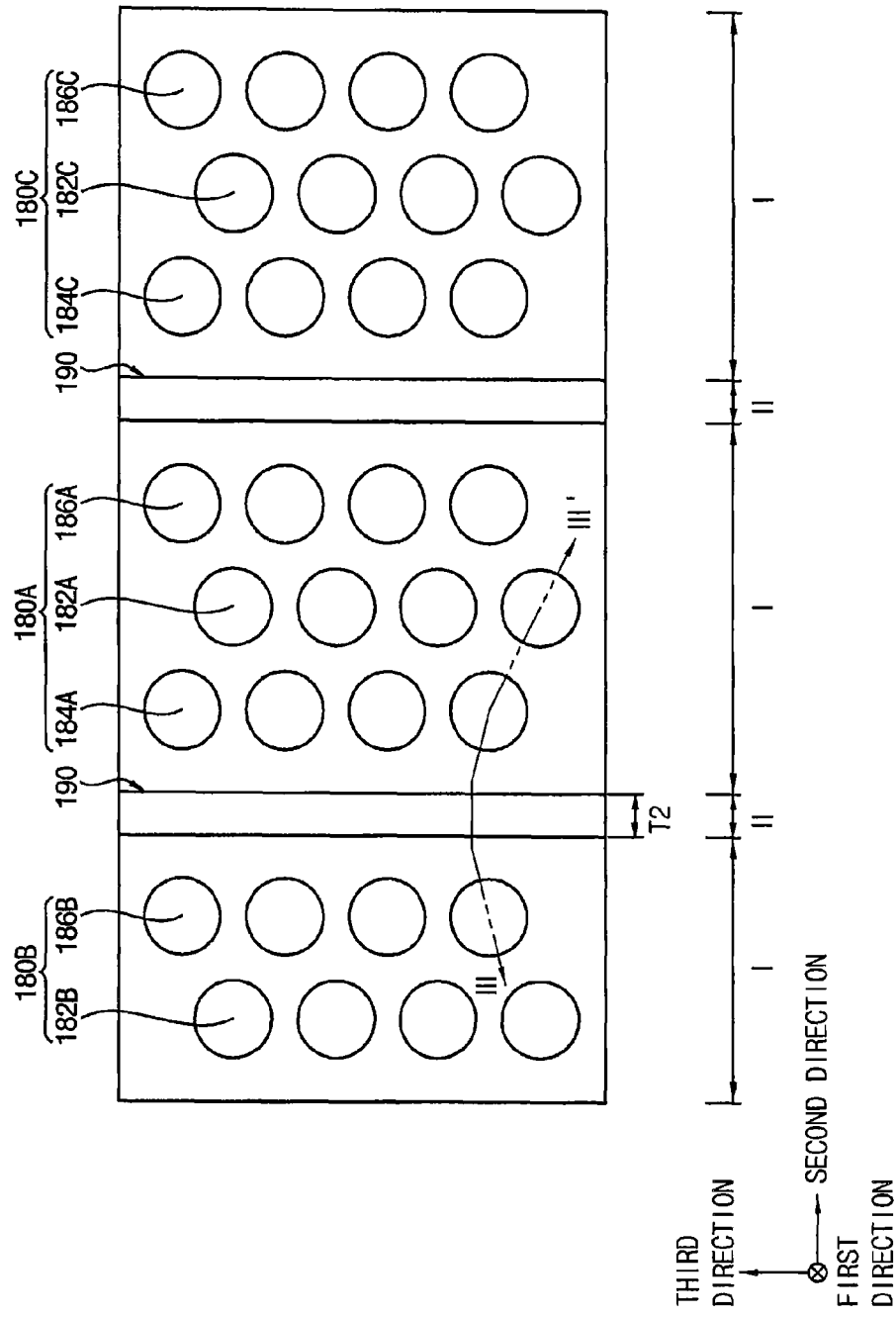
Figure 13:
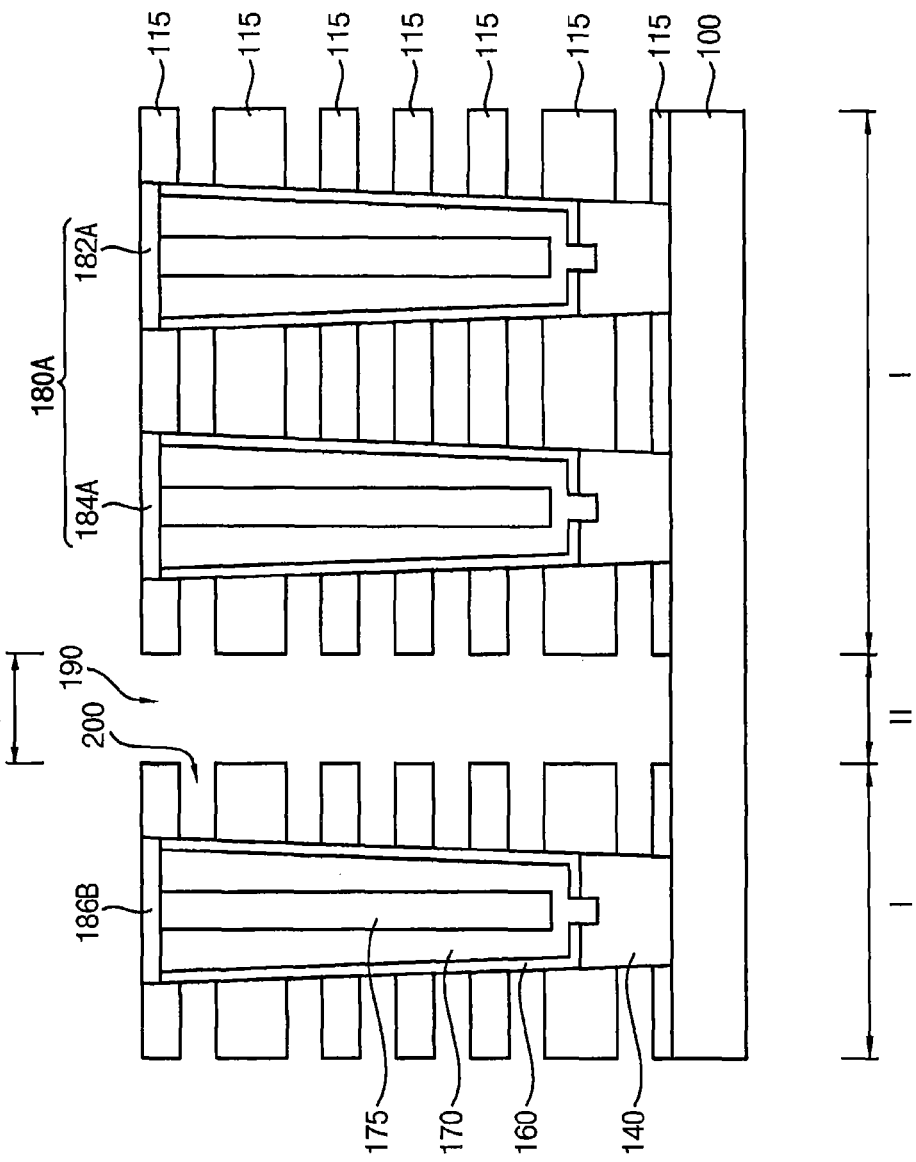

Referring to FIGS. 12 and 13, a first opening 190 may be formed through the first insulation layers 110 and the sacrificial layers 120 to expose a top surface of the substrate 100, and then the sacrificial layer 120 may be removed to form a gap 200 between the first insulation layer patterns 115 at adjacent levels.

In example embodiments, after forming a hard mask (not shown) on the uppermost first insulation layer 110, the insulation layers 110 and the sacrificial layers 120 may be, for example, dry etched using the hard mask as an etch mask to form the first opening 190. The first opening 190 may extend in the first direction.

In this case, the first opening 190 may have a width substantially the same as a second distance T2 in the second direction. In example embodiments, the second distance T2 may be less than about 80 nm. Particularly, the second distance T2 may be in a range of about 65 nm to about 75 nm. That is, as the second distance T2 decrease, the degree of integration of the vertical memory device may increase.

As the first opening 190 may be formed, the first insulation layer 110 may be transformed into a first insulation layer pattern 115. A plurality of first insulation layer patterns 115 may be formed in the second direction at each level, and each first insulation layer pattern 115 may extend in the third direction.

Then, the sacrificial layer 120 may be removed by a wet etching process. Particularly, the sacrificial layer 120 exposed by the first opening 190 may be removed by a wet etching process using phosphoric acid or sulfuric acid as a etching solution. Therefore, portions of the outer sidewall of the first blocking layer pattern 162 may be exposed by the gap 200. The gap 200 may have a width substantially the same as the first distance T1 in the first direction.

Referring to FIG. 14, a second blocking layer 210 and a gate electrode layer 220 may be formed on the exposed portion of the outer sidewall of the blocking layer pattern 162, the exposed portion of the sidewall of the semiconductor pattern 140, an inner sidewall of the gap 200, a surface of the first insulation pattern 115, the exposed top surface of the substrate 100 and top surfaces of the pad 180.

The second blocking layer 210 may be formed using an insulation material such as aluminum oxide or silicon oxide. In an example embodiment, the second blocking layer 210 may be formed by a sequentially flow deposition (SFD) process or an atomic layer deposition ALD) process.

The gate electrode layer 220 may be formed to include a metal of a low resistance, e.g., tungsten, titanium, tantalum, platinum, and the like. When the gate electrode layer 220 is formed to include tungsten, the gate electrode layer 220 may be formed by a CVD process or an SFD process using tungsten hexafluoride (WF6) as a source gas.

As mentioned above, three channel columns may be disposed in the respective single first region I, and the plurality of channels may be arranged in the zigzag pattern, so that the width of the first region I in the second direction may decrease. Therefore, the second blocking layer 210 and the gate electrode layer 220 may be conformally formed. When performing a deposition process for forming the gate electrode layer 220, the source gas molecules may easily move into the gap 200 through the first opening 190. Therefore, a void may not be formed in the gate electrode layer 220.

Further, the width of the gap 200 in the first direction may be less than about 30 nm, so that the gate electrode layer 220 may have a reduced thickness which may be limited to the width of the gap 200. Even though, the first opening 190 may have the width of about 65 nm to about 75 nm in the second direction, the upper portion of the first opening 190 may not be blocked by the gate electrode layer 220.

Referring to FIG. 11, the second blocking layer 210 the gate electrode layer 220 may be partially removed to form a plurality of gate electrodes 222, 224 and 226, and then a third insulation layer pattern 228 may be formed to fill the first opening 190.

In example embodiments, the gate electrode layer 210 may be partially removed by, for example, a wet etch process. In example embodiments, the plurality of gate electrodes 222, 224 and 226 may fill the gap 200. The plurality of gate electrodes 222, 224 and 226 may be formed to extend in the third direction.

The plurality of gate electrodes 222, 224 and 226 may include a GSL 226, the word line 222 and the SSL 224 sequentially located from a top surface of the substrate 100. Each of the GSL 226, the word line 222 and the SSL 224 may be formed at a single level or at a plurality of levels. According to at least one example embodiment, each of the GSL 226 and the SSL 224 may be formed at single level, and the word line 222 may be formed at 4 levels between the GSL 226 and the SSL 224. However, the number of GSLs 226, word lines 222 and SSLs 224 may not be limited thereto. The GSL 226 may be formed adjacent to the semiconductor pattern 140, the word line 222 and the SSL 224 may be formed adjacent to the channels 170.

In a process for partially removing the gate electrode layer 220, the second blocking layer 210 may be partially removed, the first opening 190 exposing a top surface of the substrate 100 and extending in the third direction may be formed again, and impurities may be implanted into the exposed top surface of the substrate 100 to form an impurity region 105.

In example embodiments, the impurities may include n-type impurities, for example, phosphorus and/or arsenic. In example embodiments, the impurity region 105 may extend in the third direction and serve as a common source line (CSL).

Then, the third insulation layer pattern 228 may be formed to fill the first opening 190. In example embodiments, after filling the first opening 190 with a third insulating interlayer, the third insulating interlayer may be planarized until a top surface of the uppermost first insulation layer pattern 115 may be exposed to form the third insulation layer pattern 228.

In other example embodiments, a bottom surface of the first opening 190 may be lower than a top surface of the substrate 100. Then, the impurity region 105 may be formed by a SEG process.

Figure 16:
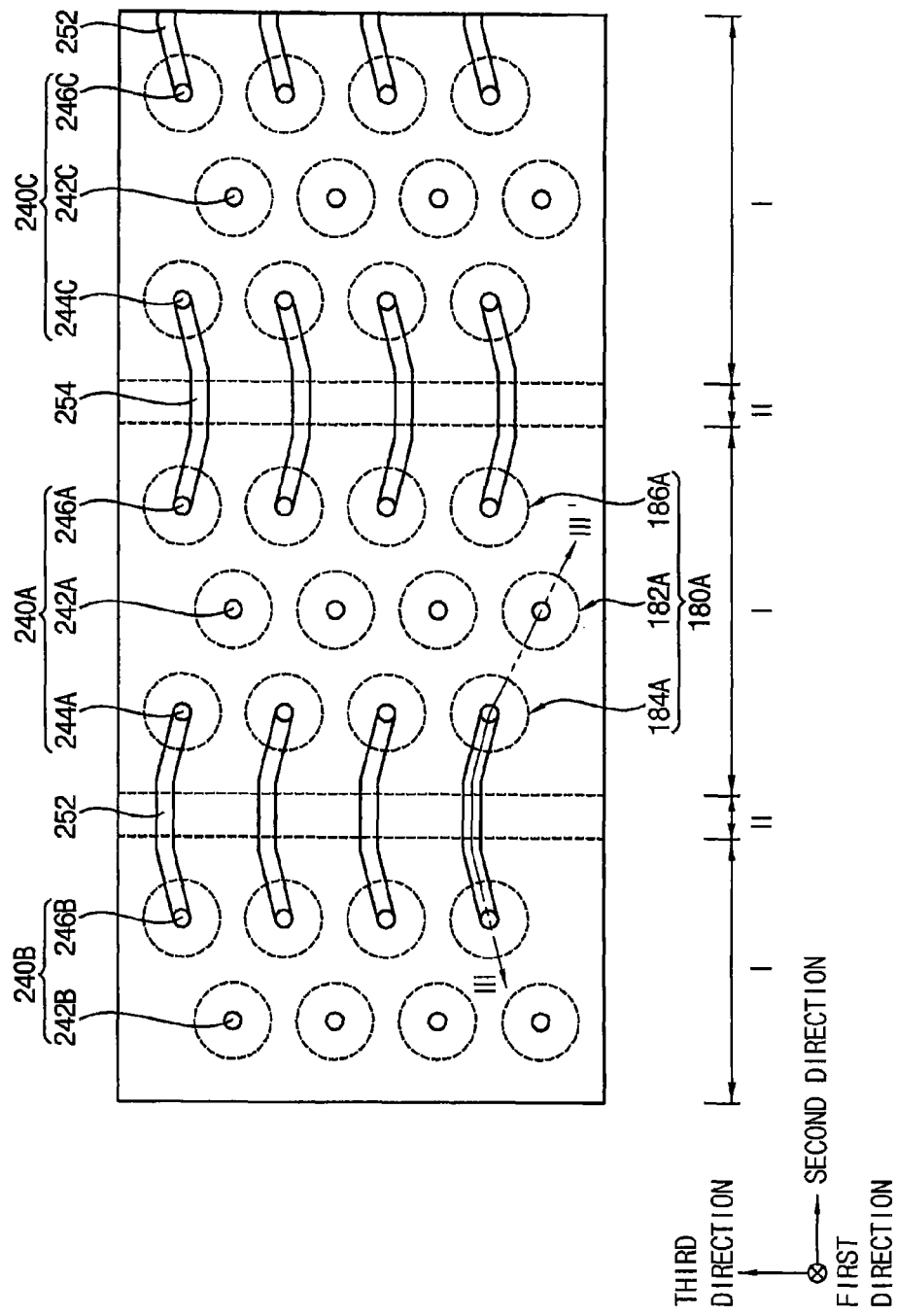
Figure 17:
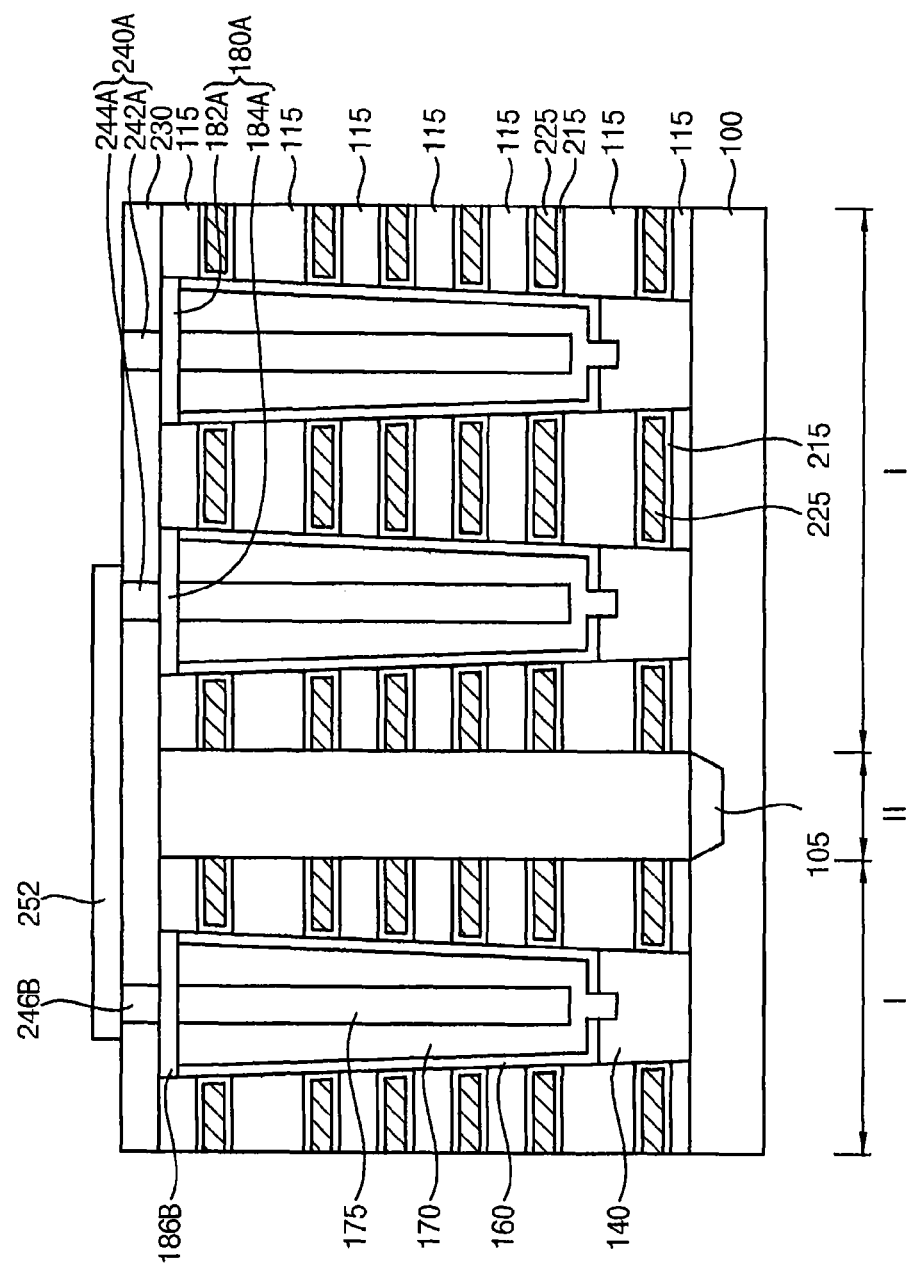

Referring to FIGS. 16 and 17, a fourth insulation layer 230 may be formed on the first and third insulation layer patterns 115 and 228 and the pads 180, contacts 240 may be formed through the fourth insulation layer 230, and then conductive patterns 252 and 254 may be formed on the fourth insulation layer 230 and the contacts 240.

In example embodiments, a plurality of contacts 240 may be arranged in the second direction and the third direction. Therefore, the plurality of contacts 240 may define a plurality of contact arrays 240A, 240B and 240C. Each of the contact arrays 240A, 240B and 240C may include a plurality of contact columns, and each of the contact columns may include the plurality of contacts 240 arranged in the third direction. The arrangement of the contacts 240 may be substantially the same as those illustrated in FIG. 2.

For example, the first contact array 240A may include a first contact column including a plurality of first contacts 242A, a second contact column including a plurality of second contacts 244A and a third contact column including a plurality of third contact 246A. Each of the first to third contacts 242A, 244A and 246A may be electrically connected to each of the first to third channels 172A, 174A and 176A through respective pads 180.

Then, a conductive layer may be formed on the fourth insulation layer 230 and the contacts 240, and the conductive layer may be partially removed to form the first conductive pattern 252 and the second conductive pattern 254. The first conductive patterns 252 and the second conductive patterns 254 may electrically connect the second contacts 244A, 244C with third contacts 246A, 246B and 246C. For example, the first conductive patterns 252 may electrically connect the second contacts 244A of the first contact array 240A with the third contacts 246B of the second contact array 240B, and the second conductive pattern 254 may electrically connect the third contacts 246A of the first contact array 240A with the second contacts 244C of the third contact array 240C as illustrated in FIG. 1. Further, the first contacts 242A, 242B and 242C may be electrically isolated from the first conductive pattern 252 and the second conductive pattern 254.

In example embodiments, a plurality of first conductive patterns 252 and a plurality of second conductive patterns 254 may be arranged in the third direction.

Further, the first conductive pattern 252 and the second conductive pattern 254 may be curved in opposite directions. For example, a central portion of the first conductive pattern 252 may be curved in the third direction, and a central portion of the second conductive pattern 254 may be curved in a direction as opposed to the third direction. Therefore, the central portion of the first conductive pattern 252 may not overlap the central portion of the second conductive pattern 254 with respect to the second direction.

Figure 18:
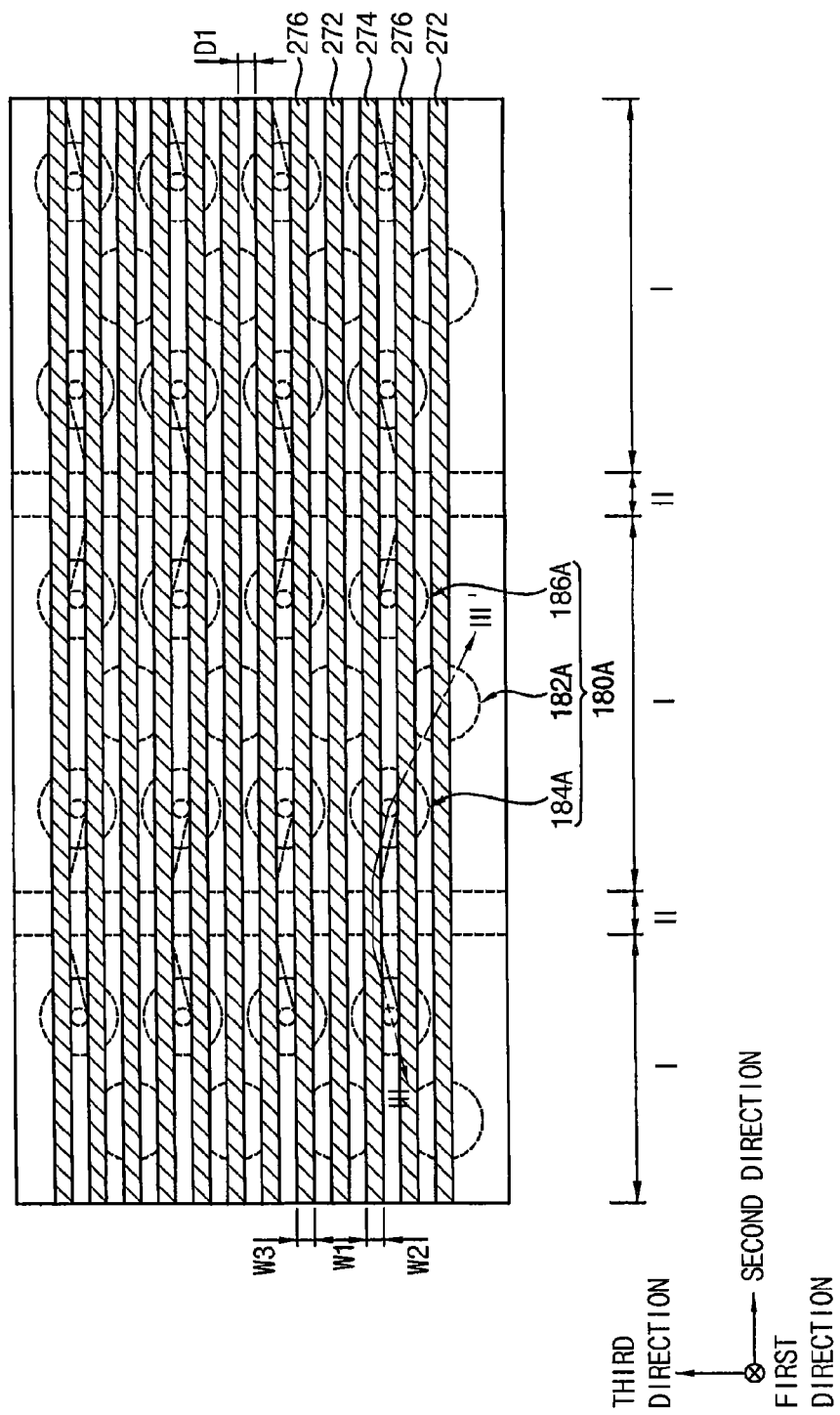
Figure 19:
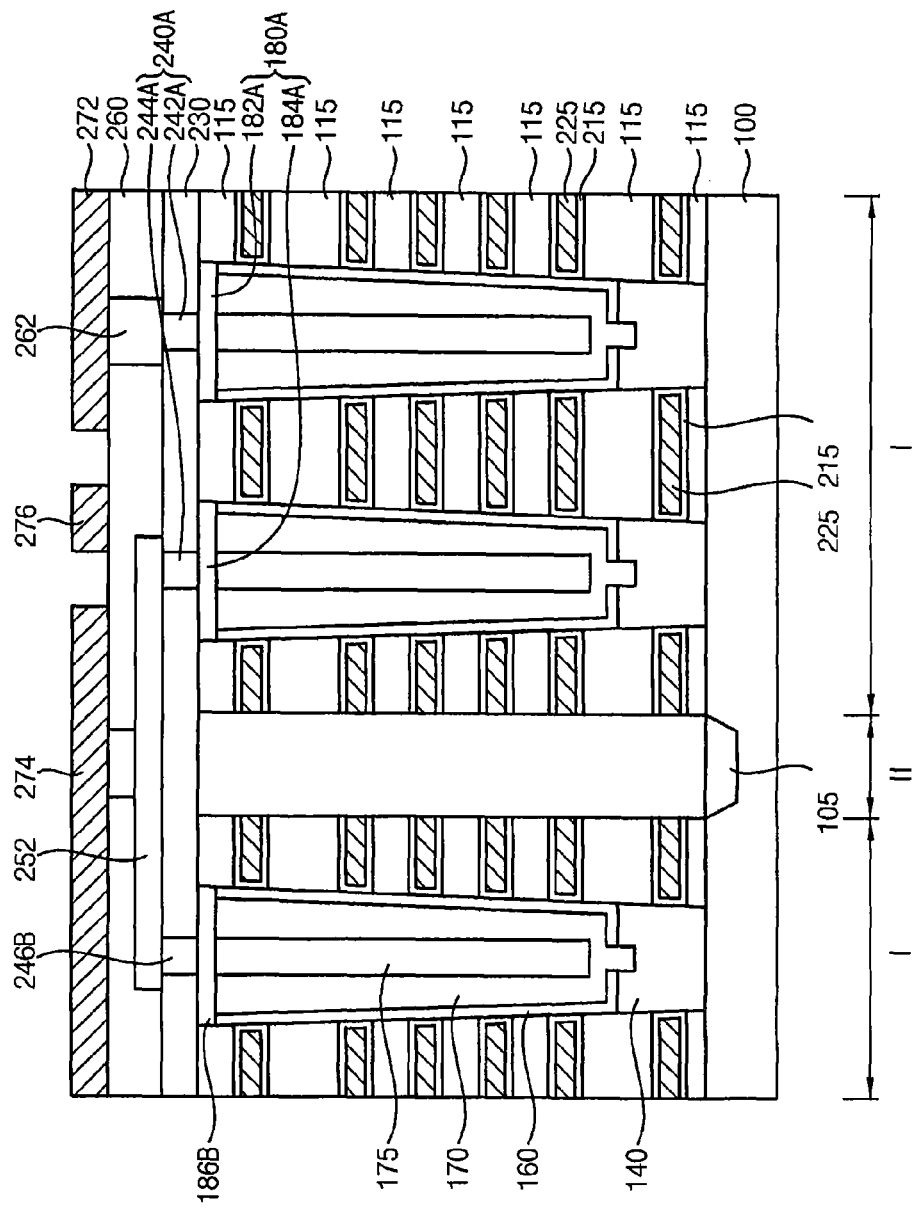

Referring to FIGS. 18 and 19, a fifth insulation layer 260 may be formed on the fourth insulation layer 230 to cover the conductive patterns 252 and 254 and the contacts 242A, bit line contacts 262, 264 and 266 may be formed through the fifth insulation layer 260, and then bit lines 272, 274 and 276 may be formed on the fifth insulation layer 260 and the bit line contacts 262, 264 and 266.

In example embodiments, a plurality of the bit line contacts 262, 264 and 266 may be arranged in the second direction and the third direction. In this case, first bit line contacts 262 may be electrically connected to the first contacts 242A, 242B and 242C, the second bit line contacts 264 may be electrically connected to the first conductive pattern 252, and the third bit line contacts 266 may be electrically connected to the second conductive pattern 254. In an example embodiment, the second and the third bit line contacts 264 and 266 may directly contact the central portions of the first and second conductive patterns 252 and 254.

Then, a bit line layer may be formed on the fifth insulation layer 260, and then the bit line layer may be patterned to form the bit lines 272, 274 and 276. In example embodiments, each of the bit lines 272, 274 and 276 may extend in the second direction. The bit lines 272, 274 and 276 may be arranged in the third direction. Particularly, the first bit line 272, the second bit line 274 and the third bit line 276 may be arranged in the third direction alternately and repeatedly.

The first to third bit lines 272, 274 and 276 may be electrically connected to the first to third bit line contacts 262, 264 and 266, respectively. Therefore, the first channel, the second channel and the third channel of one channel array may be electrically connected to different bit lines, respectively.

Further, the first to third bit lines 272, 274 and 276 may have the same width W1, W2 and W3 in the third direction, and may be spaced apart from one another by the same distance D1. The first conductive pattern 252 and the second conductive pattern 254 may be curved in opposite directions, so that the first to third bit lines 272, 274 and 276 may be spaced apart from each other by the predetermined distance. Therefore, the degree of integration of the vertical memory device may increase.

Figure 20:
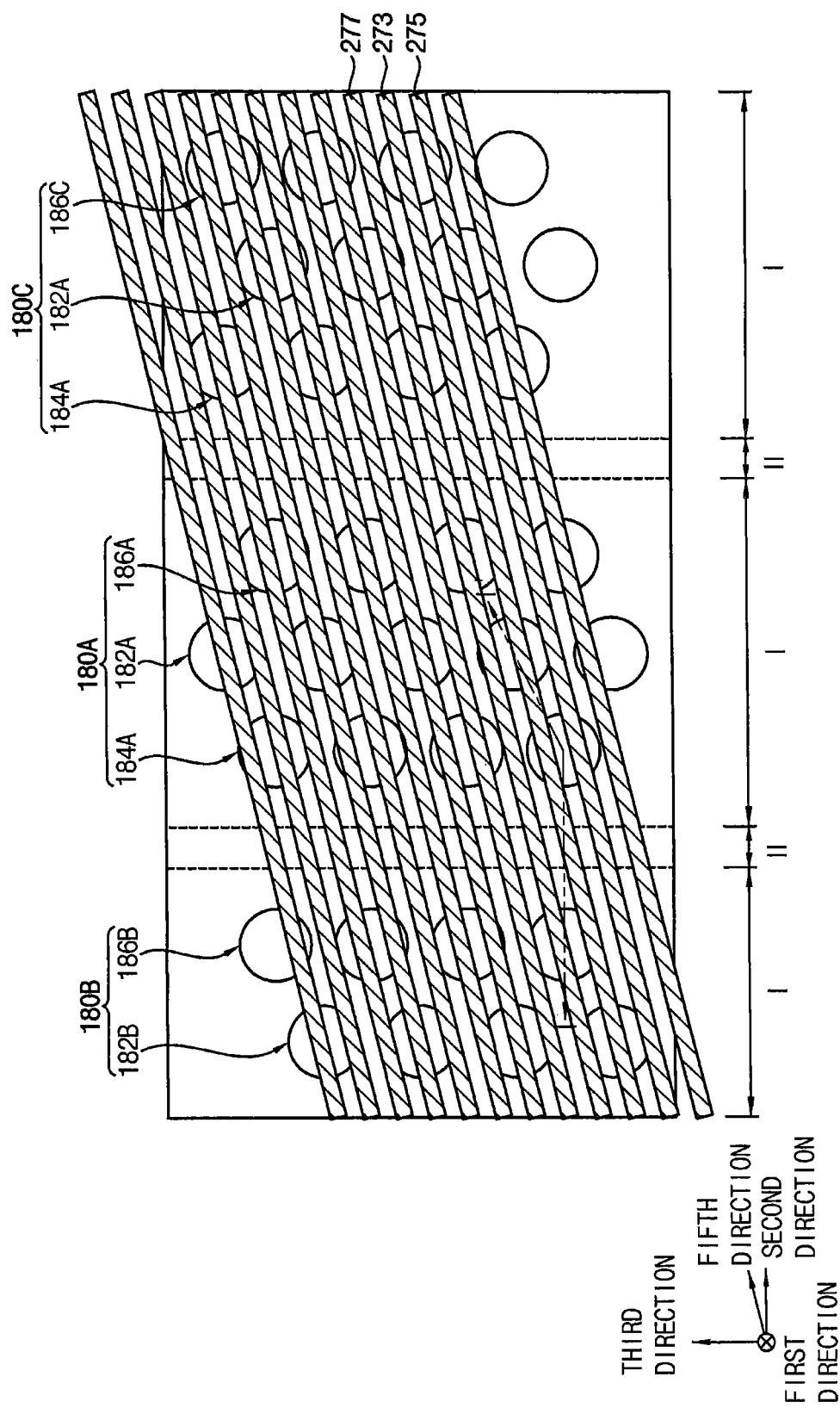
Figure 21:
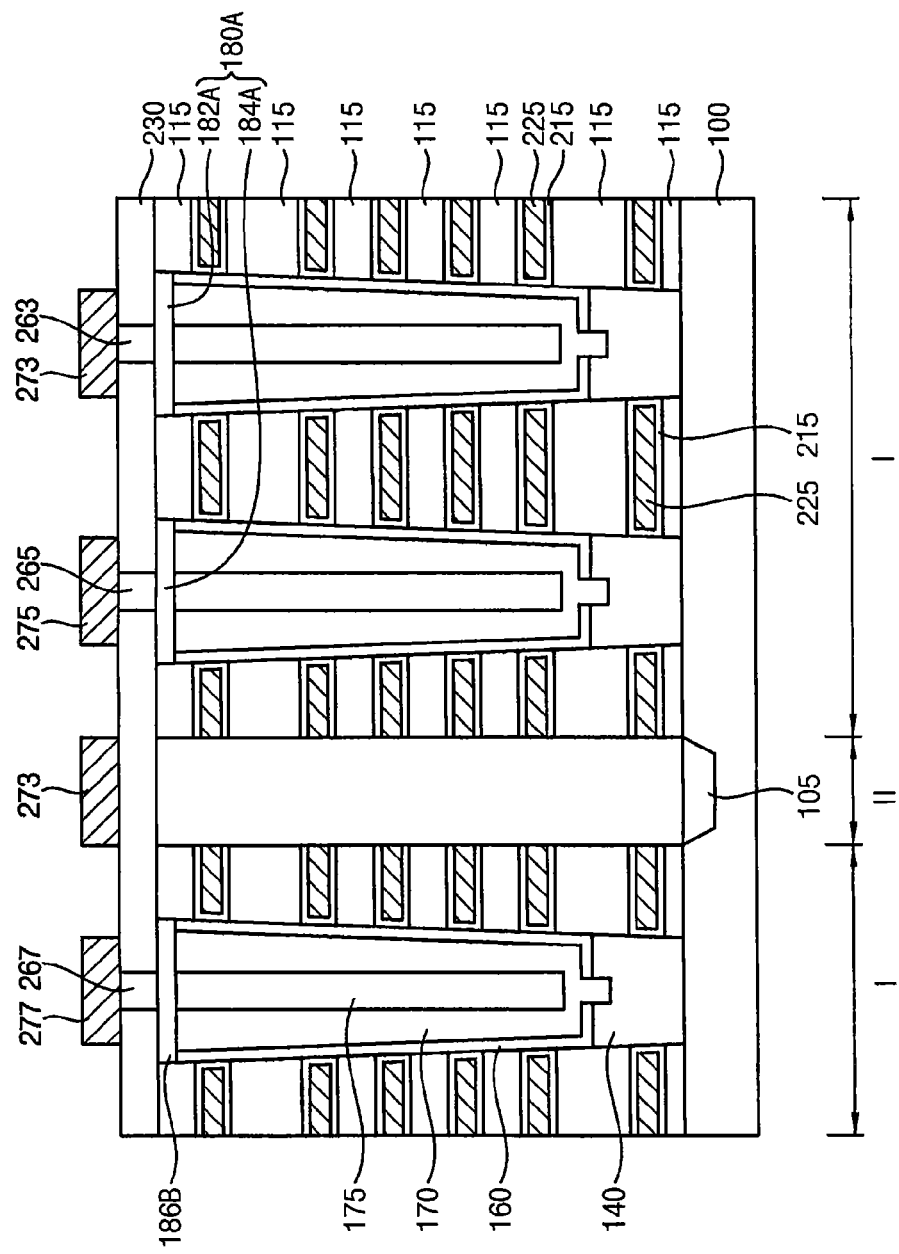

FIGS. 20 and 21 are a horizontal cross-sectional view and a vertical cross-sectional view illustrating a vertical memory device in accordance with example embodiments.

FIG. 20 is a horizontal cross-sectional view illustrating arrangements of holes and channel of the vertical memory device, and FIG. 21 is a vertical cross-sectional view cut along the line of the horizontal cross-sectional view. The vertical memory device may be substantially the same as or similar to the vertical memory device described with reference to FIGS. 1 to 5 except for an arrangement of channels and bit lines.

Referring to FIGS. 20 and 21, the vertical memory device may include a plurality of channels 17Q each of which may extend in the first direction on a substrate 100, a charge storage structure 160 stacked on an outer sidewall of each channel 170, and a plurality of gate electrodes 222, 224 and 224 disposed on an outer sidewall of the charge storage structure 160. The vertical memory device may further include the bit lines 273, 275 and 277 electrically connected to each channel 170.

The substrate 100 may include a first region I and a second region II. In example embodiments, the first region I may be a cell region in which vertical memory elements including the channels 170 may be formed.

A plurality of channels 170, a plurality of holes and a plurality of pads 180 may be disposed in the first region I of the substrate 100. In example embodiments, the plurality of channels 170, the plurality of holes and the plurality of pads 180 may constitute channel arrays, hole arrays and pad arrays 180A, 180B, 180C, respectively. Further, single channel array may be disposed in respective single first region I. In example embodiments, three channel columns may be disposed in the respective single first region I.

Referring now to FIG. 20, the bit lines 273, 275 and 277 may be electrically connected to the channels 170 through the bit line contacts 263, 265 and 267.

In example embodiments, each of the bit lines 273, 275 and 277 may extend in a fifth direction oblique to the second direction. The bit lines 273, 275 and 277 may be arranged in the third direction. Particularly, the first bit line 273, the second bit line 275 and the third bit line 277 may be arranged in the third direction alternately and repeatedly. Further, the first to third bit lines 273, 275 and 277 may have the same width W1, W2 and W3 in the third direction, and may be spaced apart from one another by the same distance D1.

As the bit lines 273, 275 and 277 may extend in the fifth direction, the first channel, the second channel and the third channel of one channel array may be electrically connected to different bit lines, respectively.

The foregoing is illustrative of at least one example embodiment and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A nonvolatile memory device, comprising:
at least four cylindrical-shaped channel regions extending vertically from portions of a substrate located at respective vertices of at least one rhomboid when viewed in a vertical direction relative to a surface of the substrate;
a charge storage layer on an outer sidewall of each of said at least four cylindrical-shaped channel regions;
a plurality of vertically-stacked gate electrodes extending adjacent each of said at least four cylindrical-shaped channel regions; and
a plurality of bit lines extending over said at least four cylindrical-shaped channel regions, said plurality of bit lines including at least first, second and third bit lines electrically coupled to respective ones of said at least four cylindrical-shaped channel regions; and
wherein the first, second and third bit lines extend parallel to each other and in a direction oblique relative to all sides of the at least one rhomboid when viewed in the vertical direction.

2. The memory device of claim 1, wherein said at least four cylindrical-shaped channel regions comprises seven cylindrical-shaped channel regions positioned at respective vertices of two rhomboids that share a common vertex when viewed in a vertical direction relative to the surface of the substrate.

3. The memory device of claim 1, wherein said at least four cylindrical-shaped channel regions comprises five cylindrical-shaped channel regions positioned at respective vertices of two rhomboids that share three common vertices when viewed in a vertical direction relative to the surface of the substrate.

4. The memory device of claim 1, wherein said at least four cylindrical-shaped channel regions comprises seven cylindrical-shaped channel regions positioned at respective vertices of four rhomboids that share a common vertex when viewed in a vertical direction relative to the surface of the substrate.

5. The memory device of claim 4, wherein one of the seven cylindrical-shaped channel regions is located at a vertex that is shared by each of the four rhomboids.

6. A vertical memory device, comprising:
a plurality of channel arrays including a plurality of channels in a first region on a substrate, each of the channels extending in a first direction substantially perpendicular to a top surface of the substrate;
a charge storage layer structure including a tunnel insulation layer pattern, a charge storage layer pattern and a blocking layer pattern which are sequentially stacked on a sidewall of each channel in a second direction substantially parallel to the top surface of the substrate; and
a plurality of gate electrodes arranged on a sidewall of the charge storage layer structure and spaced apart from each other in the first direction;
wherein each channel array includes:
a first channel column including a plurality of first channels disposed at a central portion of the first region with respect to a third direction substantially perpendicular to the first direction and the second direction;
a second channel column including a plurality of second channels disposed at an outer portion of the first region, the second channels being spaced apart from respective first channels in a fourth direction oblique to the third direction; and
a third channel column including a plurality of third channels disposed at the outer portion of the first region, the third channels being spaced apart from respective second channels in the second direction;
a first conductive pattern electrically connecting a second channel of one channel array with a third channel of another channel array; and
a second conductive pattern electrically connecting a third channel of the one channel array with a second channel of the other channel array;
wherein a plurality of first conductive patterns is arranged in the third direction, and a plurality of second conductive patterns is arranged in the third direction;
wherein a central portion of the first conductive pattern is curved in the third direction, and a central portion of the second conductive pattern is curved in a direction opposed to the third direction.

7. The vertical memory device of claim 6, wherein the first channels, the second channels and the third channels are arranged in a zigzag pattern with respect to the third direction.

8. The vertical memory device of claim 6, wherein the plurality of channel arrays include a first channel array, a second channel array spaced apart from the first channel array in a direction opposed to the second direction, and a third channel array spaced apart from the first channel array in the second direction.

9. The vertical memory device of claim 8, wherein the first conductive pattern electrically connects the second channel of the first channel array with the third channel of the second channel array, and the second conductive pattern electrically connects the third channel of the first channel array with the second channel of the third channel array.

10. The vertical memory device of claim 6, wherein the central portion of the first conductive pattern does not overlap the central portion of the second conductive pattern with respect to the second direction.

11. A vertical memory device, comprising:
a plurality of channel arrays including a plurality of channels in a first region on a substrate, each of the channels extending in a first direction substantially perpendicular to a top surface of the substrate;
a charge storage layer structure including a tunnel insulation layer pattern, a charge storage layer pattern and a blocking layer pattern which are sequentially stacked on a sidewall of each channel in a second direction substantially parallel to the top surface of the substrate; and
a plurality of gate electrodes arranged on a sidewall of the charge storage layer structure and spaced apart from each other in the first direction;
wherein each channel array includes:
a first channel column including a plurality of first channels disposed at a central portion of the first region with respect to a third direction substantially perpendicular to the first direction and the second direction;
a second channel column including a plurality of second channels disposed at an outer portion of the first region, the second channels being spaced apart from respective first channels in a fourth direction oblique to the third direction; and
a third channel column including a plurality of third channels disposed at the outer portion of the first region, the third channels being spaced apart from respective second channels in the second direction;

a first conductive pattern electrically connecting a second channel of one channel array with a third channel of another channel array;

a second conductive pattern electrically connecting a third channel of the one channel array with a second channel of the other channel array; and a plurality of first bit line, a plurality of second bit line and a plurality of third bit line electrically connected to respective channels;

wherein the first bit lines are electrically connected to the first channels, the second bit lines are electrically connected to the second channels or the third channels through the first conductive patterns, and the third bit lines are electrically connected to the second channels or the third channels through the second conductive patterns;

wherein the first bit lines overlap central portions of the first channels with respect to the first direction, the second bit lines overlap central portions of the first conductive patterns with respect to the first direction, and the third bit lines overlap central portions of the second conductive patterns with respect to the first direction.

12. The vertical memory device of claim 11, wherein the first bit lines, the second bit lines and the third bit lines extend in the second direction, and the first bit lines, the second bit lines and the third bit lines are arranged alternately and repeatedly in the third direction.

\* \* \* \* \*